United States Patent
Tseng et al.

(10) Patent No.: US 9,793,246 B1
(45) Date of Patent: Oct. 17, 2017

(54) POP DEVICES AND METHODS OF FORMING THE SAME

(71) Applicant: Taiwan Semiconductor Manufacturing Co., Ltd., Hsinchu (TW)

(72) Inventors: Hua-Wei Tseng, New Taipei (TW); An-Jhih Su, Taoyuan (TW); Hsien-Wei Chen, Hsinchu (TW); Li-Hsien Huang, Hsinchu (TW); Tien-Chung Yang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/215,590

(22) Filed: Jul. 21, 2016

Related U.S. Application Data

(60) Provisional application No. 62/343,137, filed on May 31, 2016.

(51) Int. Cl.
*H01L 23/52* (2006.01)
*H01L 25/065* (2006.01)
(Continued)

(52) U.S. Cl.
CPC ...... *H01L 25/0657* (2013.01); *H01L 23/3128* (2013.01); *H01L 23/481* (2013.01); *H01L 24/17* (2013.01); *H01L 24/48* (2013.01); *H01L 25/50* (2013.01); *H01L 2224/0239* (2013.01); *H01L 2224/02311* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/16146* (2013.01); *H01L 2224/48091* (2013.01); *H01L 2224/48106* (2013.01); *H01L 2224/48228* (2013.01); *H01L 2225/0651* (2013.01); *H01L 2225/06513* (2013.01); *H01L 2225/06548* (2013.01);
(Continued)

(58) Field of Classification Search
CPC ............. H01L 25/0657; H01L 23/3128; H01L 23/481; H01L 24/48; H01L 24/17
USPC ........................................................ 257/774
See application file for complete search history.

(56) References Cited

U.S. PATENT DOCUMENTS 7,564,115 B2    7/2009   Chen et al.
7,633,165 B2   12/2009   Hsu et al.
(Continued)

*Primary Examiner* — Luan C Thai
(74) *Attorney, Agent, or Firm* — Jianq Chyun IP Office

(57) ABSTRACT

PoP devices and methods of forming the same are disclosed. A PoP device includes a first package structure and a second package structure. The first package structure includes a first chip, and a plurality of active through integrated fan-out vias and a plurality of dummy through integrated fan-out vias aside the first chip. The second package structure includes a plurality active bumps bonded to the plurality of active through integrated fan-out vias, and a plurality of dummy bumps bonded to the plurality of dummy through integrated fan-out vias. Besides, a total number of the active through integrated fan-out vias and the dummy through integrated fan-out vias at a first side of the first chip is substantially the same as a total number of the active through integrated fan-out vias and the dummy through integrated fan-out vias at a second side of the first chip.

20 Claims, 34 Drawing Sheets

(51) Int. Cl.
*H01L 23/00* (2006.01)
*H01L 23/48* (2006.01)
*H01L 23/31* (2006.01)
*H01L 25/00* (2006.01)

(52) U.S. Cl.
CPC .............. *H01L 2225/06572* (2013.01); *H01L 2924/01022* (2013.01); *H01L 2924/01028* (2013.01); *H01L 2924/01029* (2013.01); *H01L 2924/06* (2013.01); *H01L 2924/07025* (2013.01); *H01L 2924/15172* (2013.01); *H01L 2924/15311* (2013.01)

(56) References Cited

U.S. PATENT DOCUMENTS

| | | |
|---|---|---|
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,361,842 B2 | 1/2013 | Yu et al. |
| 8,399,992 B2 * | 3/2013 | Park .................... H01L 23/3128 257/678 |
| 8,426,961 B2 | 4/2013 | Shih et al. |
| 8,669,174 B2 | 3/2014 | Wu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,802,504 B1 | 8/2014 | Hou et al. |
| 8,803,292 B2 | 8/2014 | Chen et al. |
| 8,803,306 B1 | 8/2014 | Yu et al. |
| 8,803,316 B2 | 8/2014 | Lin et al. |
| 8,809,996 B2 | 8/2014 | Chen et al. |
| 8,829,676 B2 | 9/2014 | Yu et al. |
| 8,877,554 B2 | 11/2014 | Tsai et al. |
| 8,901,730 B2 * | 12/2014 | Liu ....................... H01L 23/488 257/698 |
| 2011/0291288 A1 | 12/2011 | Wu et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0264684 A1 | 10/2013 | Yu et al. |
| 2013/0307140 A1 | 11/2013 | Huang et al. |
| 2014/0001645 A1 | 1/2014 | Lin et al. |
| 2014/0203429 A1 | 7/2014 | Yu et al. |
| 2014/0225222 A1 | 8/2014 | Yu et al. |
| 2014/0225258 A1 | 8/2014 | Chiu et al. |
| 2014/0252572 A1 | 9/2014 | Hou et al. |
| 2014/0252646 A1 | 9/2014 | Hung et al. |
| 2014/0264930 A1 | 9/2014 | Yu et al. |
| 2015/0287697 A1 | 10/2015 | Tsai et al. |
| 2015/0348872 A1 | 12/2015 | Kuo et al. |
| 2016/0276307 A1 * | 9/2016 | Lin ....................... H01L 21/561 |

\* cited by examiner

POP DEVICES AND METHODS OF FORMING THE SAME

CROSS-REFERENCE TO RELATED APPLICATION

This application claims the priority benefits of U.S. provisional application Ser. No. 62/343,137, filed on May 31, 2016. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips.

However, there are many challenges related to 3DICs.

DETAILED DESCRIPTION

Figure 1A:
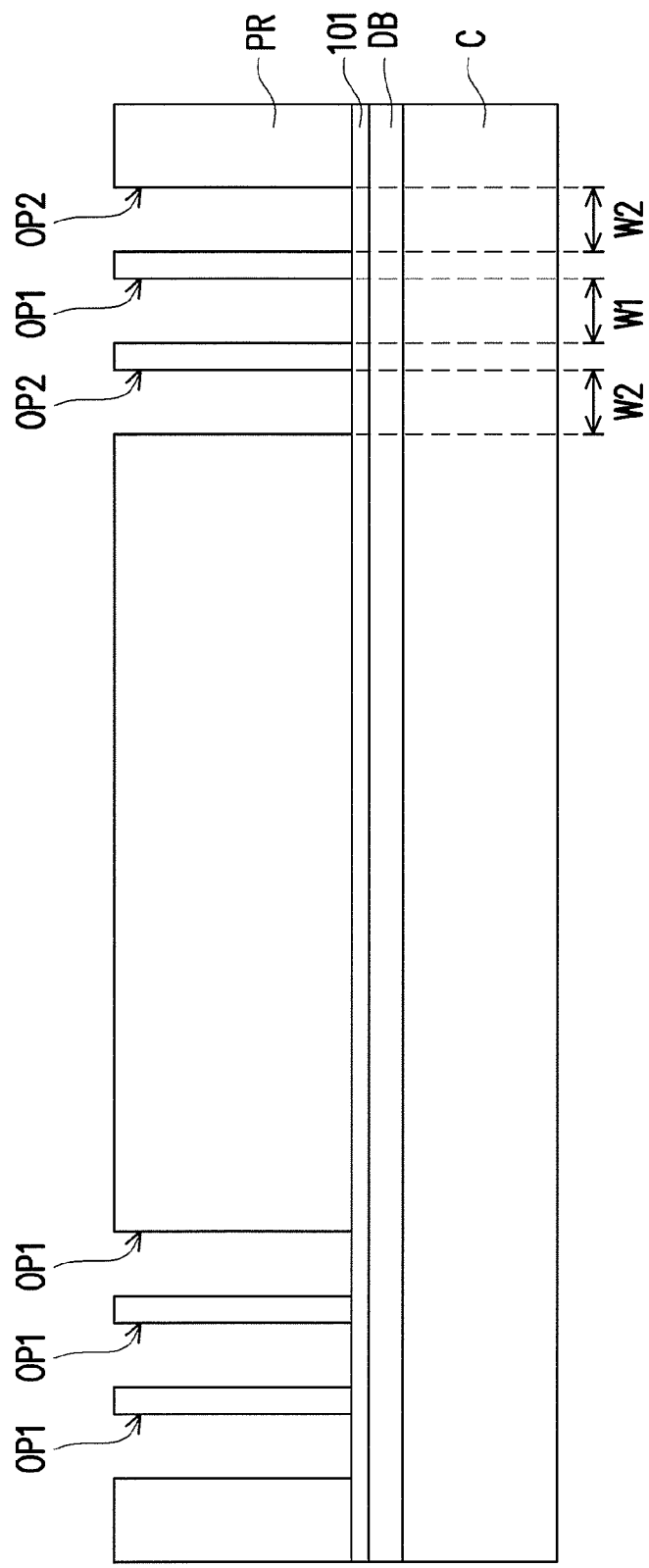
FIG. 1A to FIG. 1G are cross-sectional views of a method of forming a PoP device in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1G are cross-sectional views of a method of forming a PoP device in accordance with some embodiments.

Figure 1B:
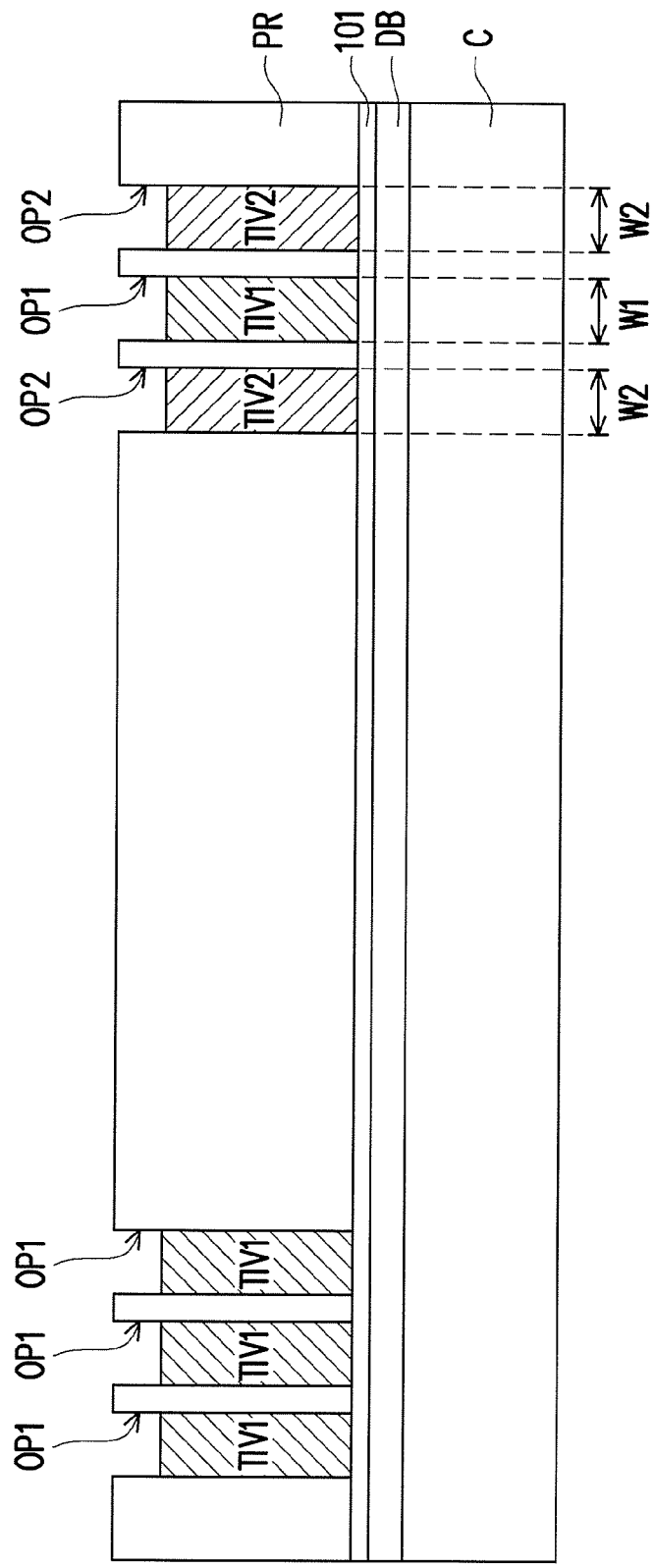

Referring to FIG. 1A and FIG. 1B, a plurality of active through integrated fan-out (InFO) vias TIV1 and a plurality of dummy through integrated fan-out (InFO) vias TIV2 are formed on a carrier C.

Herein, active through integrated fan-out vias indicate functional through integrated fan-out vias, and dummy through integrated fan-out vias indicate non-functional through integrated fan-out vias. Specifically, the active through integrated fan-out vias in a package structure are electrically connected to a front-side or back-side redistribution layer structure or an electrical component of the same package structure or another package structure. However, the dummy through integrated fan-out vias are at a floating potential and electrically insulated from a front-side or back-side redistribution layer structure or an electrical component of the same package structure or another package structure. In some embodiments, the through integrated fan-out vias are called through package vias (TPV) or through interface vias.

In some embodiments, the carrier C has a de-bonding layer DB and a dielectric layer 101 formed thereon, and the de-bonding layer DB is between the carrier C and the dielectric layer 101. In some embodiments, the carrier C is a glass substrate, the de-bonding layer DB is a light-to-heat conversion (LTHC) release layer formed on the glass substrate, and the dielectric layer 101 is a polymer layer formed on the de-bonding layer. For example, the dielectric layer 101 includes polybenzoxazole (PBO), polyimide (PI), a suitable organic or inorganic material or the like.

As shown in FIG. 1A, a photoresist layer PR is formed on the dielectric layer 101 of the carrier C. In some embodiments, a seed layer (not shown) is formed between the photoresist layer PR and the dielectric layer 101. The seed layer is a titanium/copper composited layer, and is formed by a sputtering or a suitable technique. In some embodiments, the photoresist layer PR is a dry film resist (DFR) and has openings OP1 and openings OP2 that expose the intended locations for the subsequently formed active through integrated fan-out vias TIV1 and dummy through integrated fan-out vias TIV2. In some embodiments, the openings OP1 have a width W1, the openings OP2 have a width W2, and the width W1 is substantially the same as the width W2. However, the present disclosure is not limited thereto. In alternative embodiments, the width W1 of the openings OP1 is different from the width W2 of the opening OP2.

Thereafter, as shown in FIG. 1B, an electroplating process is performed to form a metal layer (e.g., a copper layer) on the seed layer exposed by the openings OP1 and OP2 of the photoresist layer OR. The photoresist layer PR and the underlying seed layer are then removed, so that active through integrated fan-out vias TIV1 having a width W1 are formed in the openings OP1 and dummy through integrated fan-out vias TIV2 having a width W2 are formed in the openings OP2 of the photoresist layer PR. The photoresist layer PR is then removed.

Figure 1C:
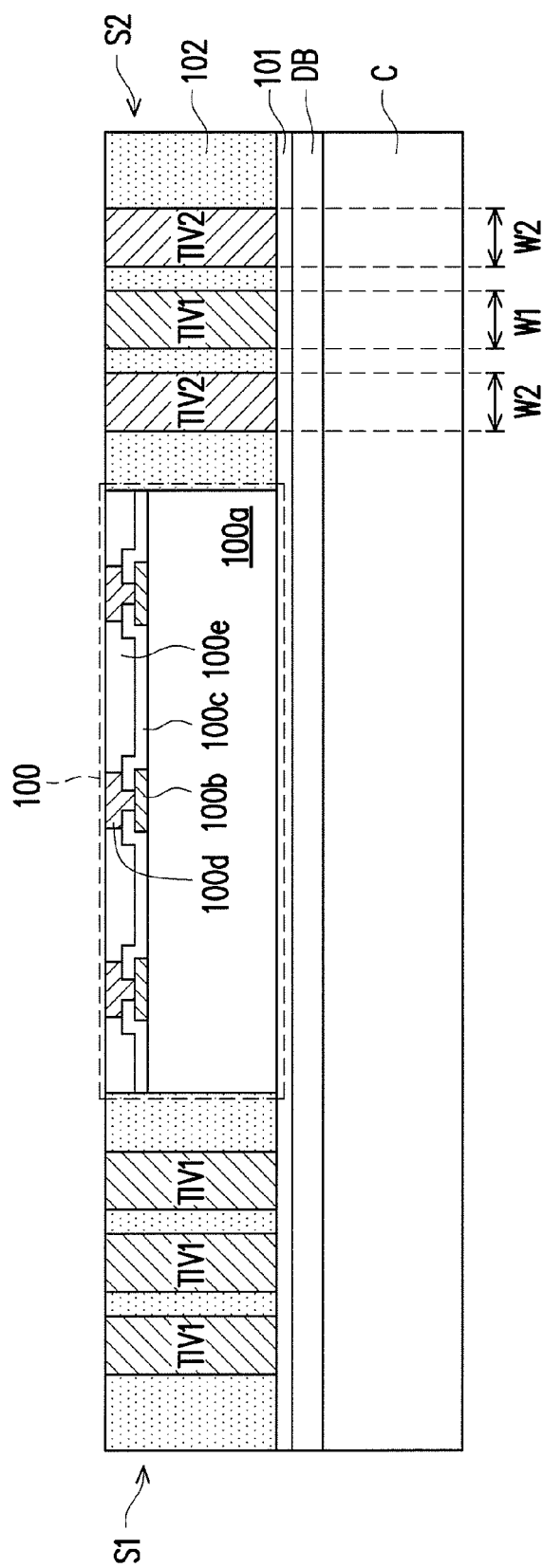

Referring to FIG. 1C, a first chip 100 is picked and placed on the carrier C such that the active through integrated fan-out vias TIV1 and the dummy through-via TIV2 are aside or around the first chip 100.

In some embodiments, the first chip 100 is adhered to the dielectric layer 101 through a die-attach film (DAF) or the like. In some embodiments, the first chip 100 has a substrate 100a, pads 100b over the substrate 100a, a passivation layer 100c over the substrate 100a and exposing portions of the pads 100b, connectors 100d over the passivation layer 100c and electrically connected to the pads 100b, and a protection layer 100e over the passivation layer 100c and aside the connectors 100d. In some embodiments, the connectors 100d include solder bumps, gold bumps, copper posts or the like, and are formed by an electroplating process. In some embodiments, the protection layer 100e includes polybenzoxazole (PBO), polyimide (PI), a suitable organic or inorganic material or the like.

Figure 2:
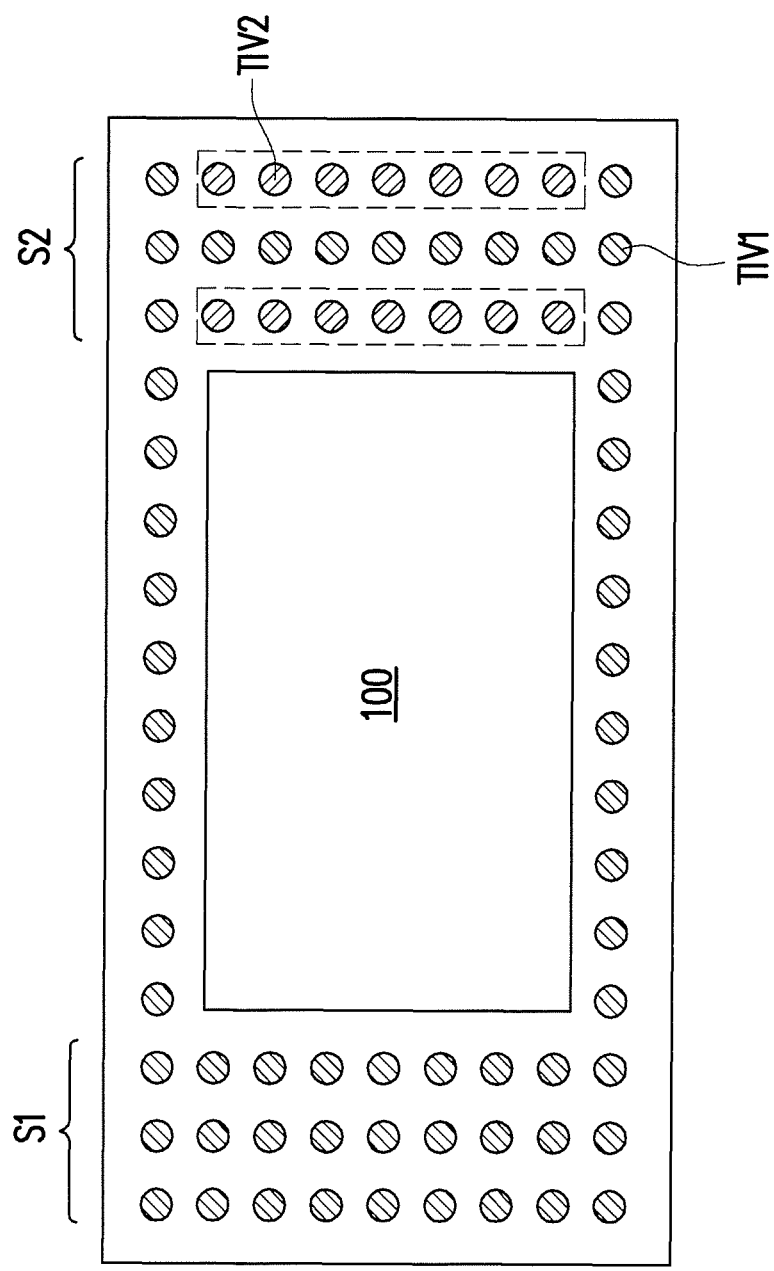
FIG. 2 illustrates a top view of active and dummy through integrated fan-out vias of a PoP device in accordance with some embodiments.

It is noted that, in some embodiments, the total number of the active through integrated fan-out vias TIV1 and the dummy through integrated fan-out vias TIV2 at a first side S1 of the first chip 100 is substantially the same as the total number of the active through integrated fan-out vias TIV1 and the dummy through integrated fan-out vias TIV2 at a second side S2 of the first chip 100, as show in FIG. 2. Such disposition is beneficial to improve the PoP bonding performance, which will be described in details below.

Herein, when elements at a first side are described as having "substantially the same total number" as that of the elements at a second side, the total number of the elements at the first side can be equal to the total number of the elements at the second side, or the difference between the total numbers at first and second sides is less than about 10 percent or even less than about 5 percent.

In some embodiments, with the proviso that the total number of through integrated fan-out vias is substantially the same, the active through integrated fan-out vias TIV1 can be at two sides of the first chip 100, and the dummy through integrated fan-out vias TIV2 can be at one of the two sides of the first chip 100. For example, as shown in the top view of FIG. 2, the active through integrated fan-out vias TIV1 are at the first side S1 and the second side S2 of the first chip 100, and the dummy through integrated fan-out vias TIV2 is at the second side S2 of the first chip 100. However, the disclosure is not limited thereto. In alternative embodiments, the active through integrated fan-out vias TIV1 are at one of the two sides of the first chip 100, and the dummy through integrated fan-out vias TIV2 are at the other of the two sides of the first chip 100, which will be described in details in FIG. 8 and FIG. 10. In yet alternative embodiments, the active and dummy through integrated fan-out vias TIV1 and TIV2 are at each of the two sides of the first chip 100.

Besides, as shown in FIG. 2, the distribution of the active through integrated fan-out vias TIV1 and the dummy through integrated fan-out vias TIV2 at the first side S1 of the first chip 100 is substantially symmetrical to the distribution of the active through integrated fan-out vias TIV1 and dummy through integrated fan-out vias TIV2 at the second side S2 of the first chip 100. Specifically, the active through integrated fan-out vias TIV1 and the dummy through integrated fan-out vias TIV2 at the first side S1 are symmetrical to those at the second side S2 in configuration and position with respect to the central first chip 100.

Continue referring to FIG. 1C, an encapsulant 102 is formed over the carrier C aside the first chip 100, the active through integrated fan-out vias TIV1 and the dummy through integrated fan-out vias TIV2. In some embodiments, the encapsulant 102 surrounds the first chip 100, the active through integrated fan-out vias TIV1 and the dummy through integrated fan-out vias TIV2, and exposes the surfaces of the active through integrated fan-out vias TIV1, the dummy through integrated fan-out vias TIV2 and the connectors 100d. The encapsulant 102 includes a molding compound such as epoxy, a photo-sensitive material such as polybenzoxazole (PBO), polyimide (PI) or benzocyclobutene (BCB), a combination thereof or the like. The method of forming the encapsulant 102 includes forming an encapsulant material layer (not shown) on the carrier C covering the first chip 100, the active through integrated fan-out vias TIV1 and the dummy through integrated fan-out vias TIV2, and performing a grinding process to partially remove the encapsulant material layer.

Figure 1D:
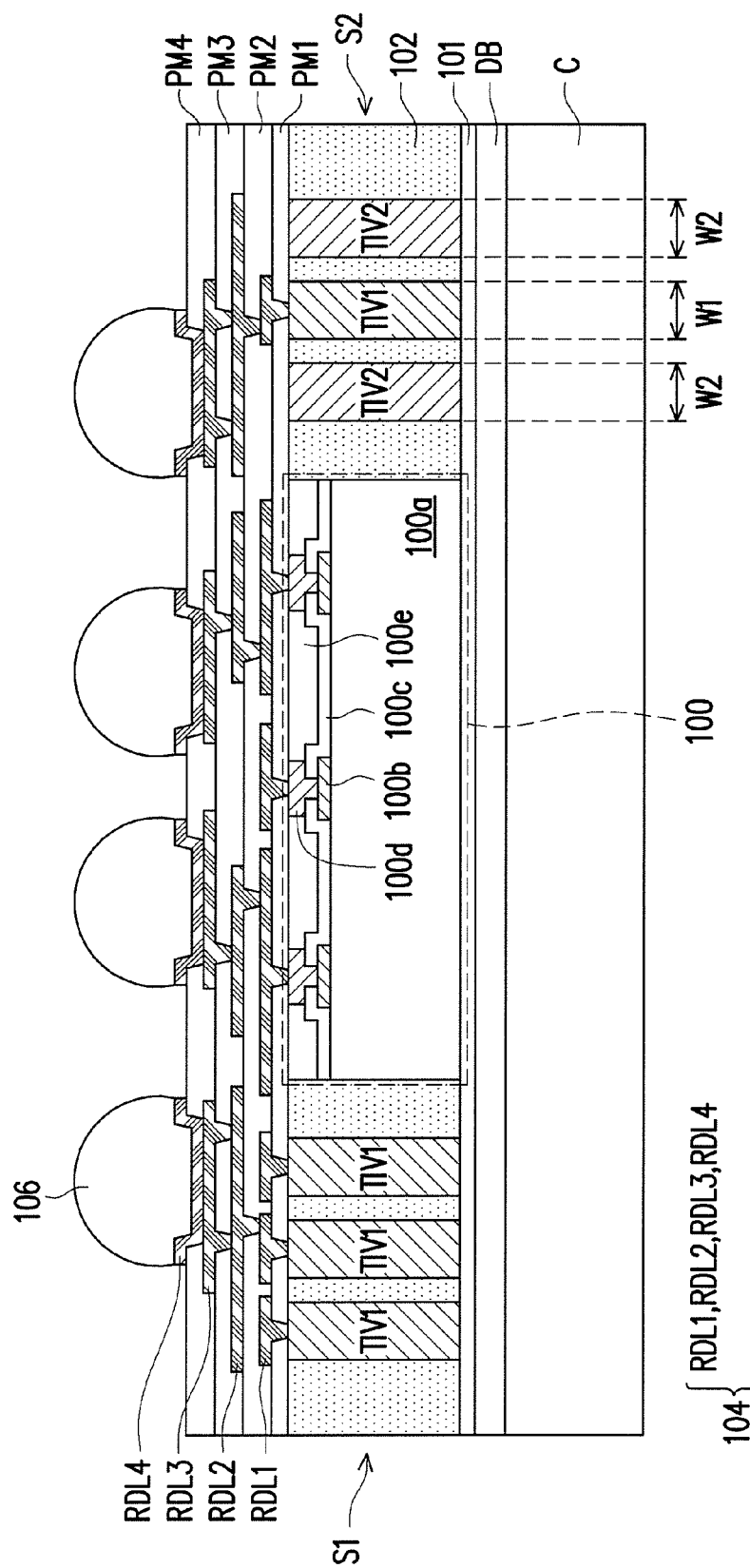

Referring to FIG. 1D, a redistribution layer structure 104 is formed over and electrically connected to the first chip 100 and the active through integrated fan-out vias TIV1. The redistribution layer structure 104 is referred to as a "front-side redistribution layer structure" through the specification. In some embodiments, the redistribution layer structure 104 includes a plurality of polymer layers PM1, PM2, PM3 and PM4 and a plurality of redistribution layers RDL1, RDL2, RDL3 and RDL4 stacked alternately. The number of the polymer layers or the redistribution layers is not limited by the disclosure.

Specifically, the redistribution layer RDL1 is electrically connected to the connectors 100d and the active through integrated fan-out vias TIV1 and penetrates through the polymer layer PM1. In some embodiments, the redistribution layer RDL1 includes a plurality of RDL1 caps electrically connected to the corresponding active through integrated fan-out vias TIV1. The redistribution layer RDL2 is electrically connected to the redistribution layer RDL1 and penetrates through the polymer layer PM2. The redistribution layer RDL3 is electrically connected to the redistribution layer RDL2 and penetrates through the polymer layer PM3. The redistribution layer RDL4 is electrically connected to the redistribution layer RDL3 and penetrates through the polymer layer PM4. In some embodiments, the topmost redistribution layer RDL4 is also called an under-ball metallurgy (UBM) layer for ball mount. In some embodiments, each of the polymer layers PM1, PM2, PM3 and PM4 includes a photo-sensitive material such as polybenzoxazole (PBO), polyimide (PI), benzocyclobutene (BCB), a combination thereof or the like. In some embodiments, each of the redistribution layers RDL1, RDL2, RDL3 and RDL4 includes copper, nickel, titanium, a combination thereof or the like, and is formed by an electroplating process.

Thereafter, balls or bumps 106 are formed over and electrically connected to the redistribution layer RDL4 of the redistribution layer structure 104. In some embodiments, the bumps 106 are made of a conductive material with low resistivity, such as Sn, Pb, Ag, Cu, Ni, Bi or an alloy thereof, and are formed by a suitable process such as evaporation, plating, ball drop, or screen printing.

Figure 1E:
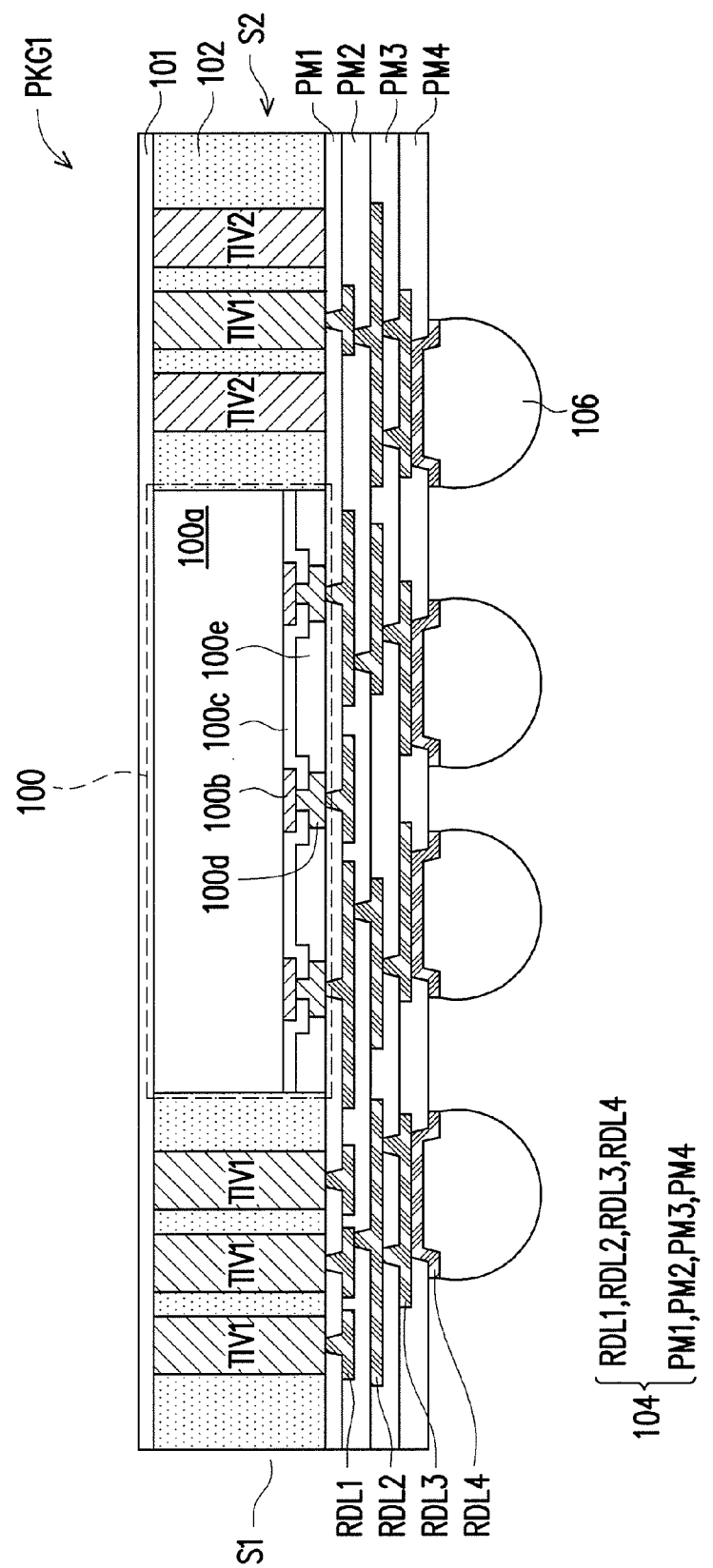

Referring to FIG. 1E, the carrier C is de-bonded from the backside of the first package structure PKG1. In some embodiments, the carrier C with the first chip 100, the active and dummy through integrated fan-out vias TIV1 and TIV2, the redistribution layer structure 104 and the bumps 106 is turned over, the de-bonding layer DB is decomposed under heat of light, and the carrier C is then released from the first package structure PKG1.

Figure 1F:
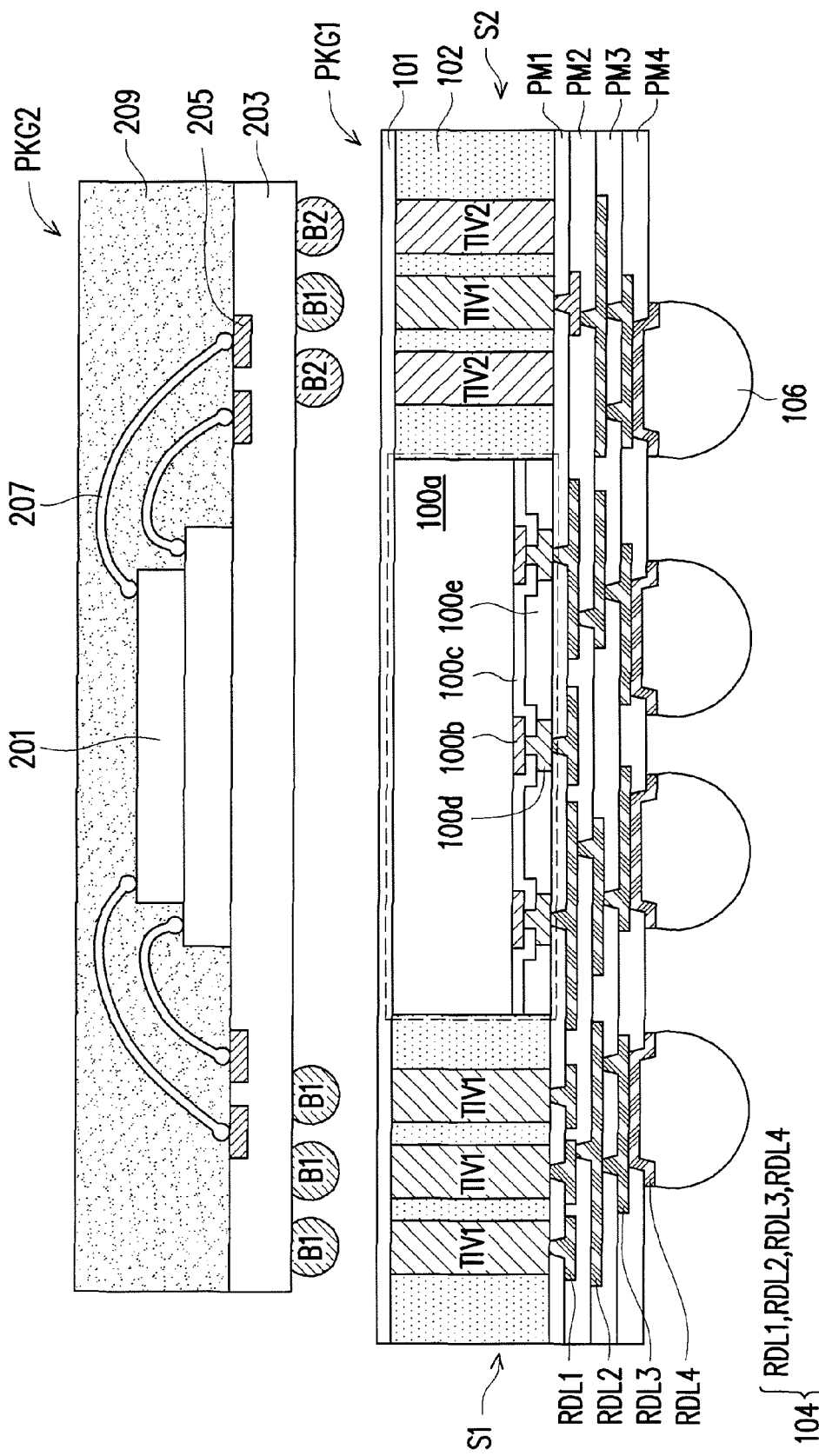

Referring to FIG. 1F, a second package structure PKG2 is provided. In some embodiments, the second package structure PKG2 has a substrate 203, a second chip 201 mounted on one surface (e.g. top surface) of the substrate 203, and a plurality of active bumps B1 and a plurality of dummy bumps B2 formed on the opposite surface (e.g., bottom surface) of the substrate 203. In some embodiments, the active bumps B1 and the dummy bumps B2 are metal bumps such as solder bumps. In some embodiments, active bonding pads and dummy bonding pads (not shown) may be formed in the bottom surface portion of the substrate 203. The active bonding pads may be bonded to the active bumps B1 and provide electrical connection between the active bumps B1 and the second chip 201. The dummy bonding pads may be bonded to the dummy bumps B2.

Herein, active bumps indicate functional bumps, and dummy bumps indicate non-functional bumps. Specifically, the active bumps in a package structure are electrically connected to an electrical component of the same package structure or another package structure. However, the dummy bumps are at a floating potential and electrically insulated from an electrical component of the same package structure or another package structure.

In some embodiments, the second package structure PKG2 further has bonding wires 207 that provide electrical connection between the second chip 201 and bonding pads 205 in the top surface portion of the substrate 203. An encapsulant 209 is formed over the components to protect the components from the environment and external contaminants. A redistribution layer structure and through integrated fan-out vias (not shown) may be formed in the substrate 203 to provide electrical connection between the bonding pads 205 and the active bumps B1.

Figure 1G:
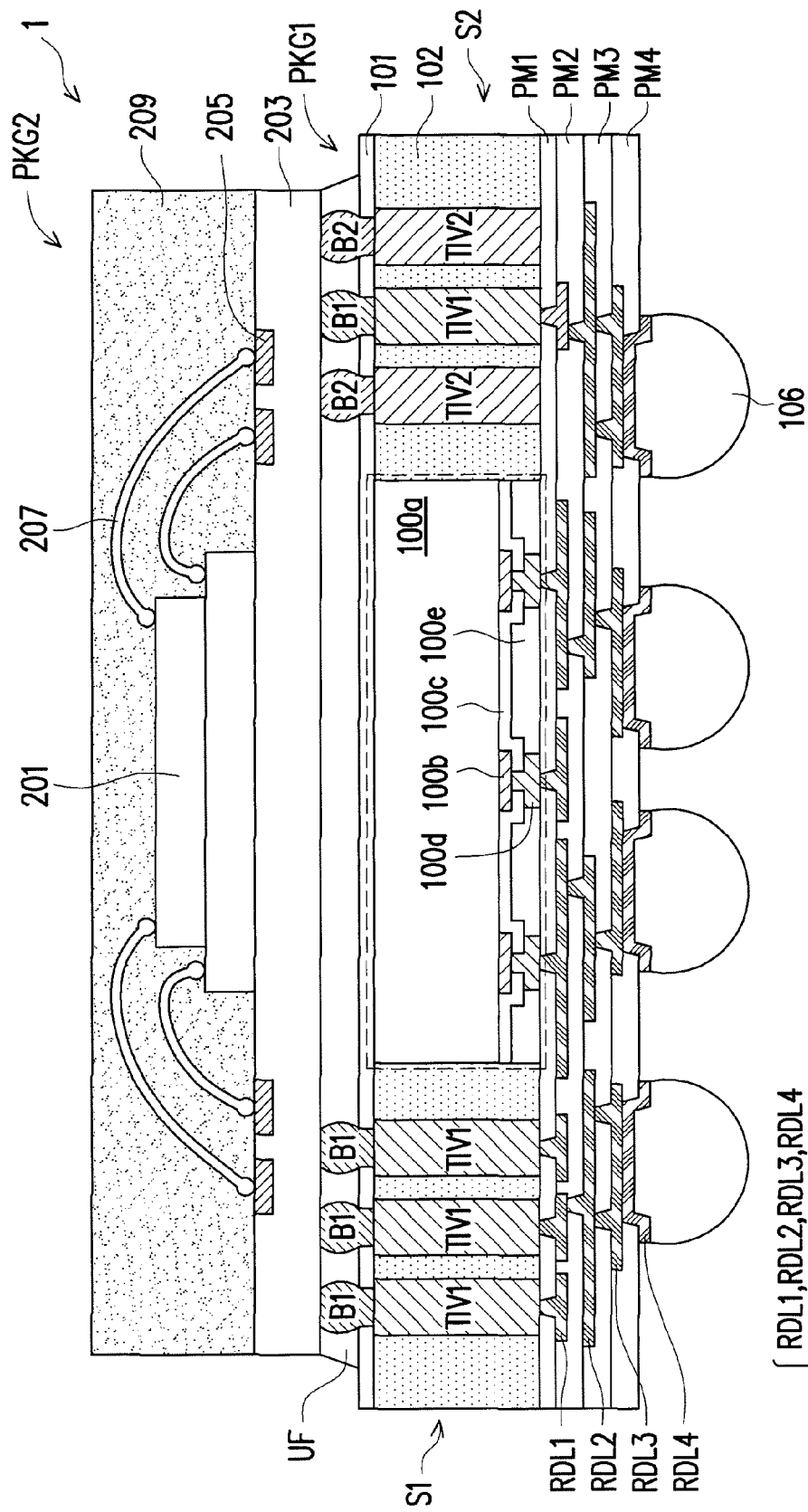

Referring to FIG. 1G, the second package structure PKG2 is then bonded to the first package structure PKG1 to form a PoP device 1. In some embodiments, the active bumps B1 of the second package structure PKG2 are aligned and inserted into the openings in the dielectric layer 101, and are bonded to the active through integrated fan-out vias TIV1 of the first package structure PKG1, and the dummy bumps B2 of the second package structure PKG2 are aligned and inserted into the openings in the dielectric layer 101, and are bonded to the dummy through integrated fan-out vias TIV2 of the first package structure PKG1.

Thereafter, an under-fill layer UF is formed to fill the space between the first package structure PKG1 and the second package structure PKG2 and to surround the active and dummy bumps B1 and B2. In some embodiments, the under-fill layer UF includes a molding compound such as epoxy, and is formed using dispensing, injecting, and/or spraying techniques.

In some embodiments, the through integrated fan-out vias (including active and dummy through integrated fan-out vias TIV1 and TIV2) of the lower package structure are distributed in a symmetrical manner and correspond to the bumps (including active and dummy bumps B1 and B2) of the upper package structure, so the PoP bonding performance can be significantly improved, and the conventional poor filling of the under-fill layer, poor joint, and package shit issues are not observed.

FIG. 3A to FIG. 3G are cross-sectional views of a method of forming a PoP device in accordance with alternative embodiments. In the method of FIG. 3A to FIG. 3G, dummy backside patterns (rather than dummy through integrated fan-out vias) are provided in a package structure for bonding to dummy bumps of another package structure. Specifically, the formation of dummy through integrated fan-out vias is not required. The difference is illustrated in details below, and the similarity is not iterated herein.

Figure 3A:
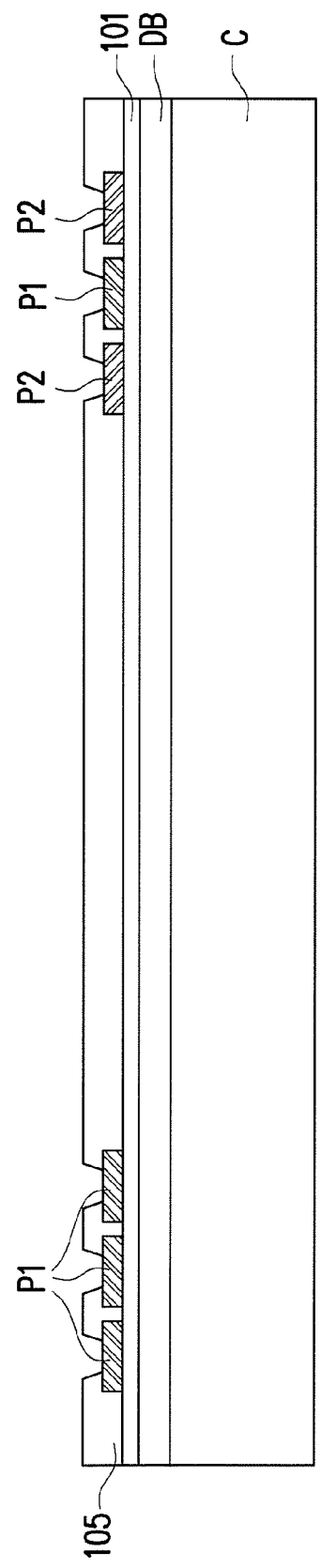
FIG. 3A to FIG. 3G are cross-sectional views of a method of forming a PoP device in accordance with alternative embodiments.

Referring to FIG. 3A, a redistribution layer structure 103 is formed on a carrier C. The redistribution layer structure 103 is referred to as a "backside redistribution layer structure" through the specification. In some embodiments, the redistribution layer structure 103 includes polymer layers, redistribution layers and/or pads. For example, the redistribution layer structure 103 includes a plurality of active pads P1 and a plurality of dummy pads P2 embedded in a polymer layer 105. Specifically, the polymer layer 105 is formed over the dielectric layer 101, covers the dummy pads P2 and has openings that respectively expose surfaces of the active pads P1. In some embodiments, the polymer layer 105 includes a photo-sensitive material such as polybenzoxazole (PBO), polyimide (PI), benzocyclobutene (BCB), a combination thereof or the like. Herein, active pads indicate functional pads, and dummy pads indicate non-functional pads.

Figure 3B:
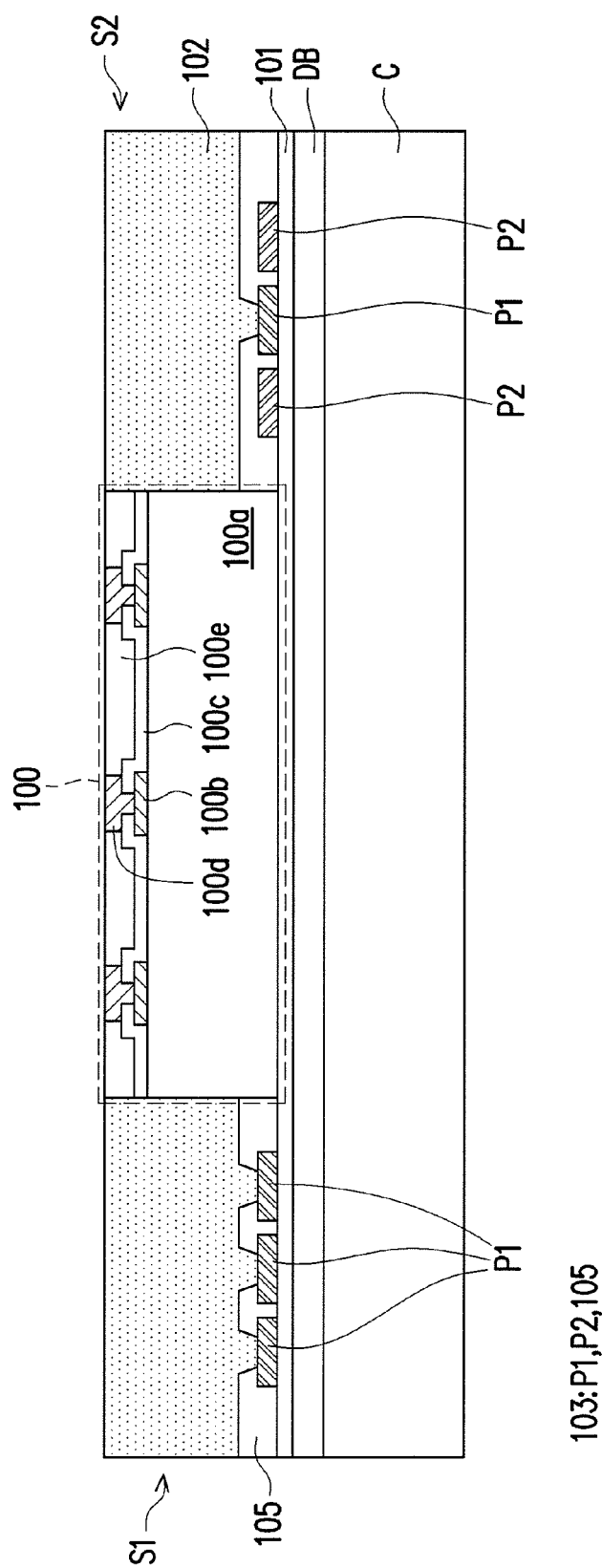

Referring to FIG. 3B, a first chip 100 is picked and placed on the carrier C such that the active pads P1 and the dummy pads P2 are aside or around the first chip 100. Thereafter, an encapsulant 102 is formed aside the first chip 100 and over the active pads P1 and the dummy pads P2. Specifically, the encapsulant 102 is formed over the polymer layer 105, filling in the openings of the polymer layer 105.

Figure 4:
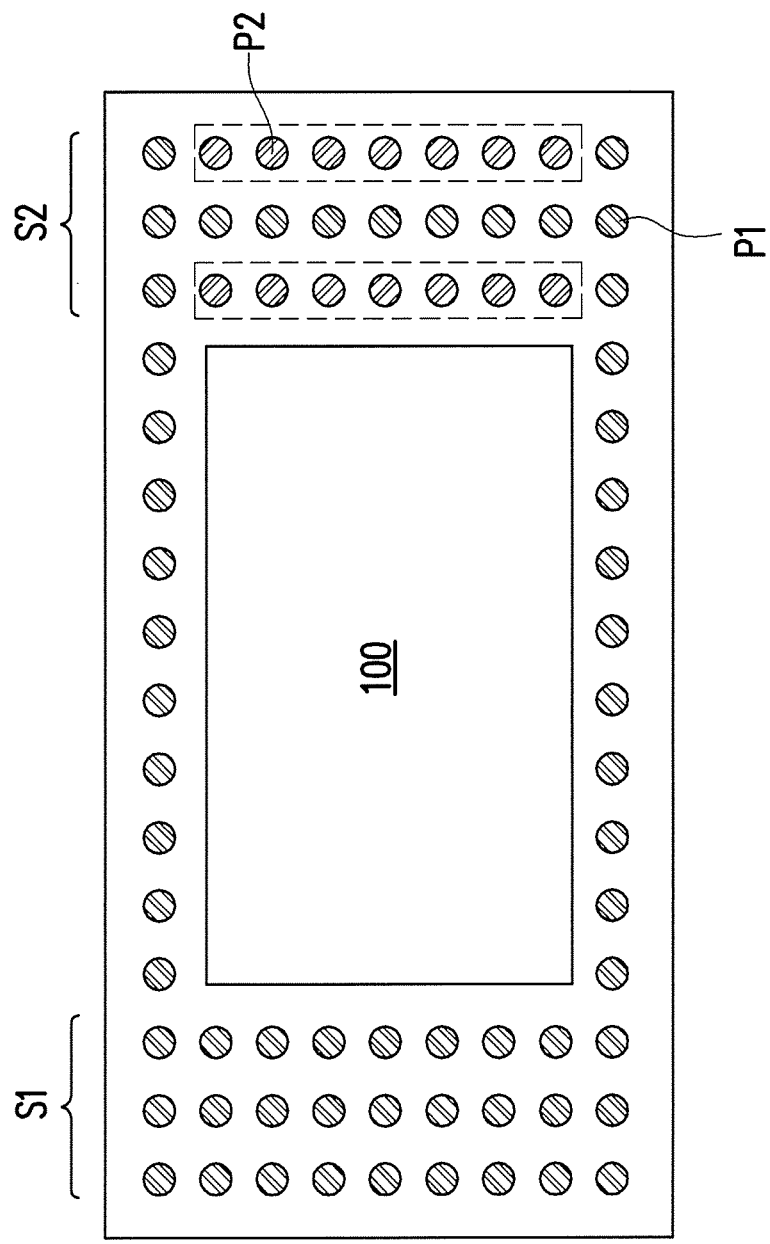
FIG. 4 illustrates a top view of active and dummy pads of a PoP device in accordance with alternative embodiments.

It is noted that, in some embodiments, the total number of the active pads P1 and the dummy pads P2 at a first side S1 of the first chip 100 is substantially the same as the total number of the active pads P1 and the dummy pads P2 at a second side S2 of the first chip 100, as show in FIG. 4. Such disposition is beneficial to improve the PoP bonding performance.

In some embodiments, with the proviso that the total number of backside pads is substantially the same, the active pads P1 can be at two sides of the first chip 100, and the dummy pads P2 can be at one of the two sides of the first chip 100. For example, as shown in the top view of FIG. 4, the active pads P1 are at the first side S1 and the second side S2 of the first chip 100, and the dummy pads P2 is at the second side S2 of the first chip 100. However, the disclosure is not limited thereto. In alternative embodiments, the active pads P1 are at one of the two sides of the first chip 100, and the dummy pads P2 are at the other of the two sides of the first chip 100, which will be described in details in FIG. 6. In yet alternative embodiments, the active and dummy pads P1 and P2 are at each of the two sides of the first chip 100.

Figure 6:
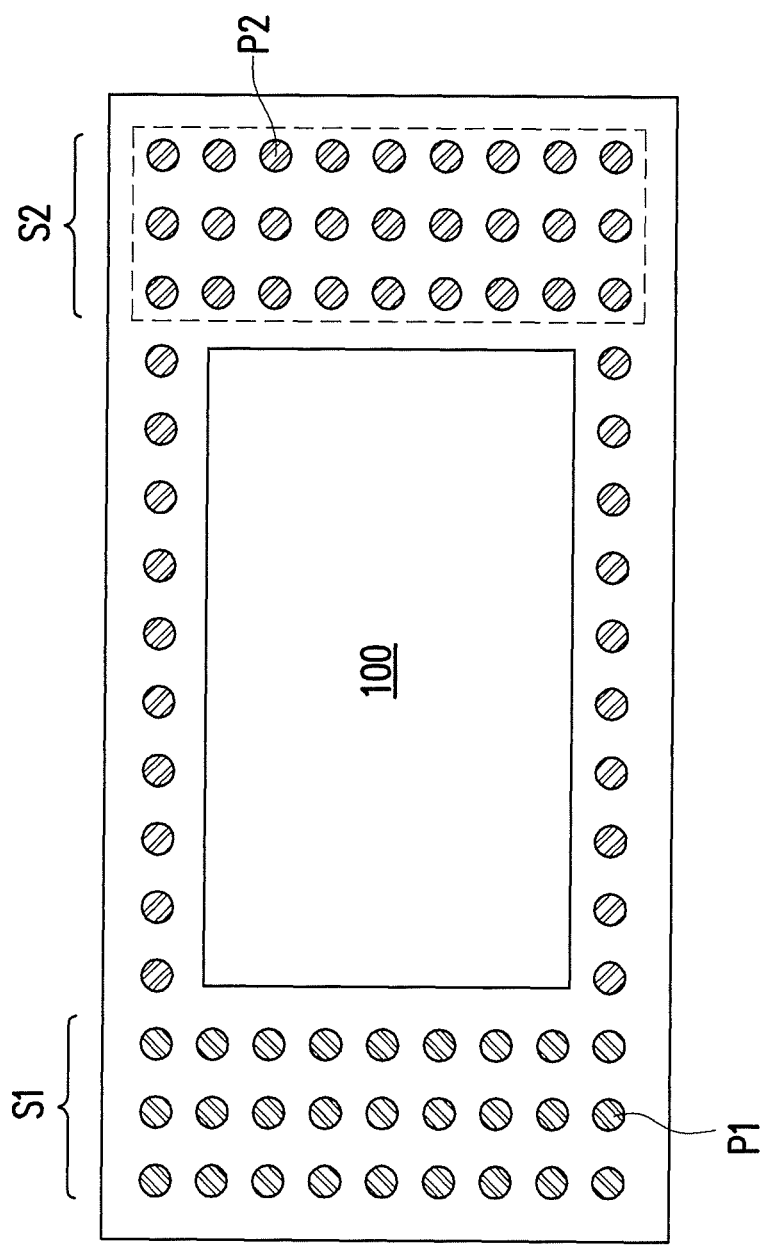
FIG. 6 illustrates a top view of active and dummy pads of a PoP device in accordance with yet alternative embodiments.

Besides, as shown in FIG. 4 and FIG. 6, the distribution of the pads P1 and the pads P2 at the first side S1 of the first chip 100 is substantially symmetrical to the distribution of the active pads P1 and dummy pads P2 at the second side S2 of the first chip 100. Specifically, the active pads P1 and the dummy pads P2 at the first side S1 are symmetrical to those at the second side S2 in configuration and position with respect to the central first chip 100.

Figure 3C:
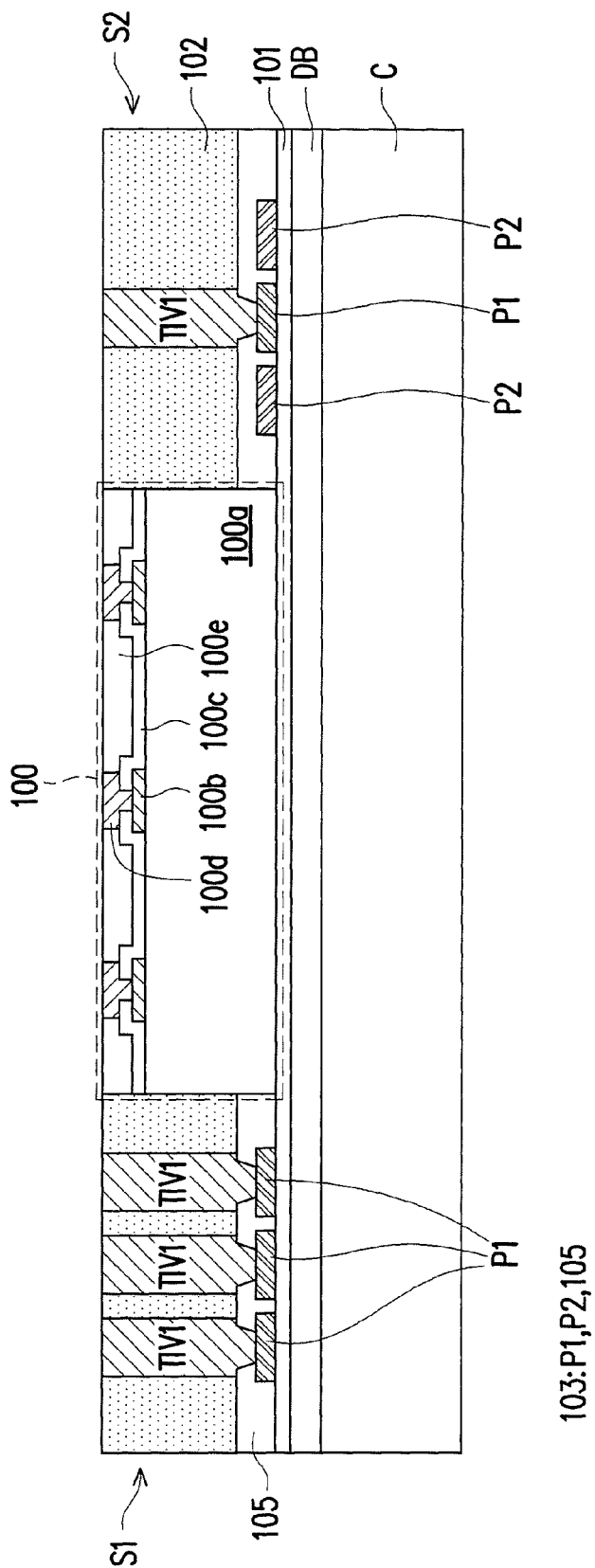

Referring to FIG. 3C, a plurality of active through integrated fan-out vias TIV1 are formed through the encapsulant 102 and electrically connected to the active pads P1.

Figure 3D:
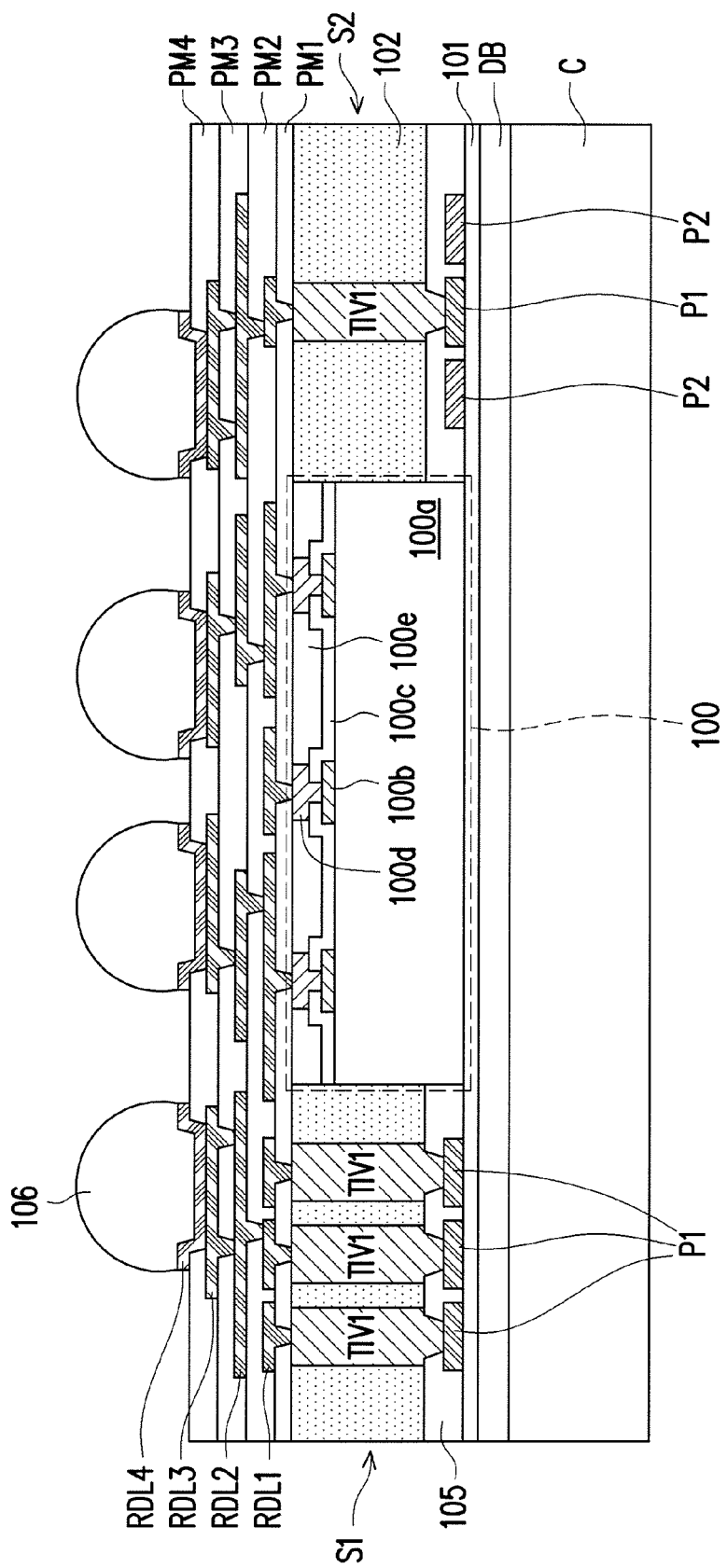

Referring to FIG. 3D, a distribution layer 104 is formed over and electrically connected to the first chip 100 and the active through integrated fan-out vias TIV1. Bumps 106 are formed over and electrically connected to the redistribution layer structure 104.

Figure 3E:
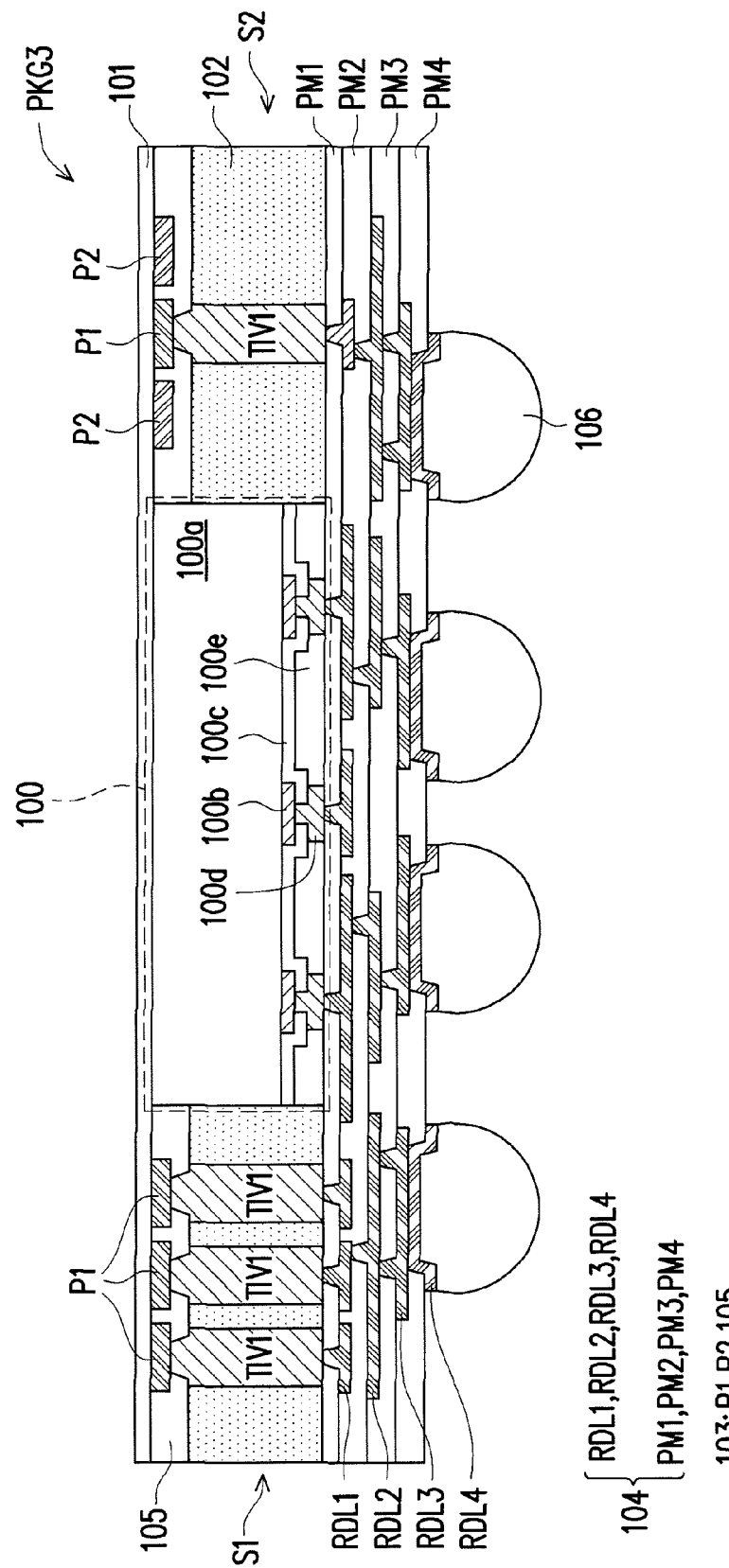

Referring to FIG. 3E, the carrier C is de-bonded from the backside of the first package structure PKG3.

Figure 3F:
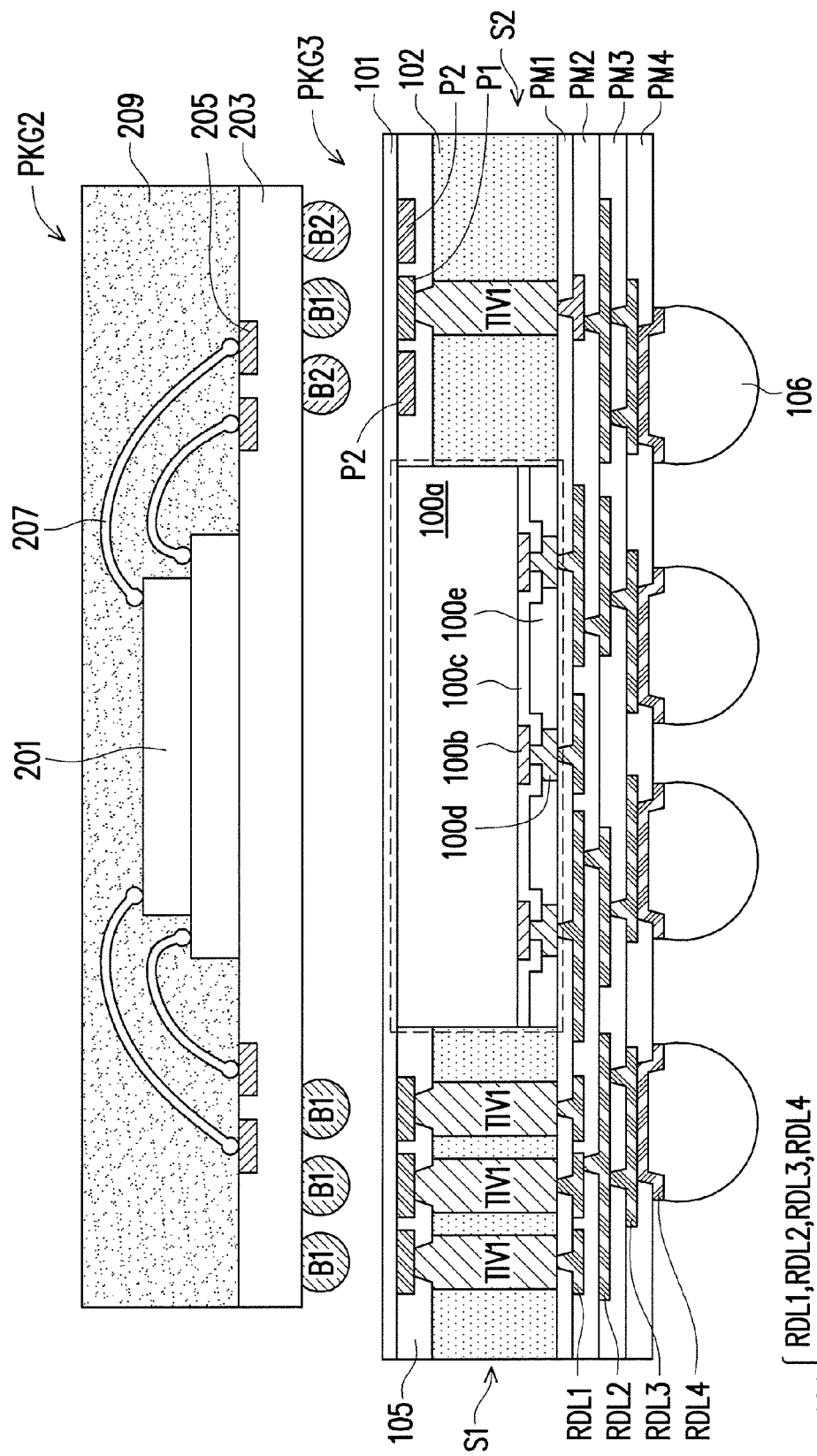
Figure 3G:
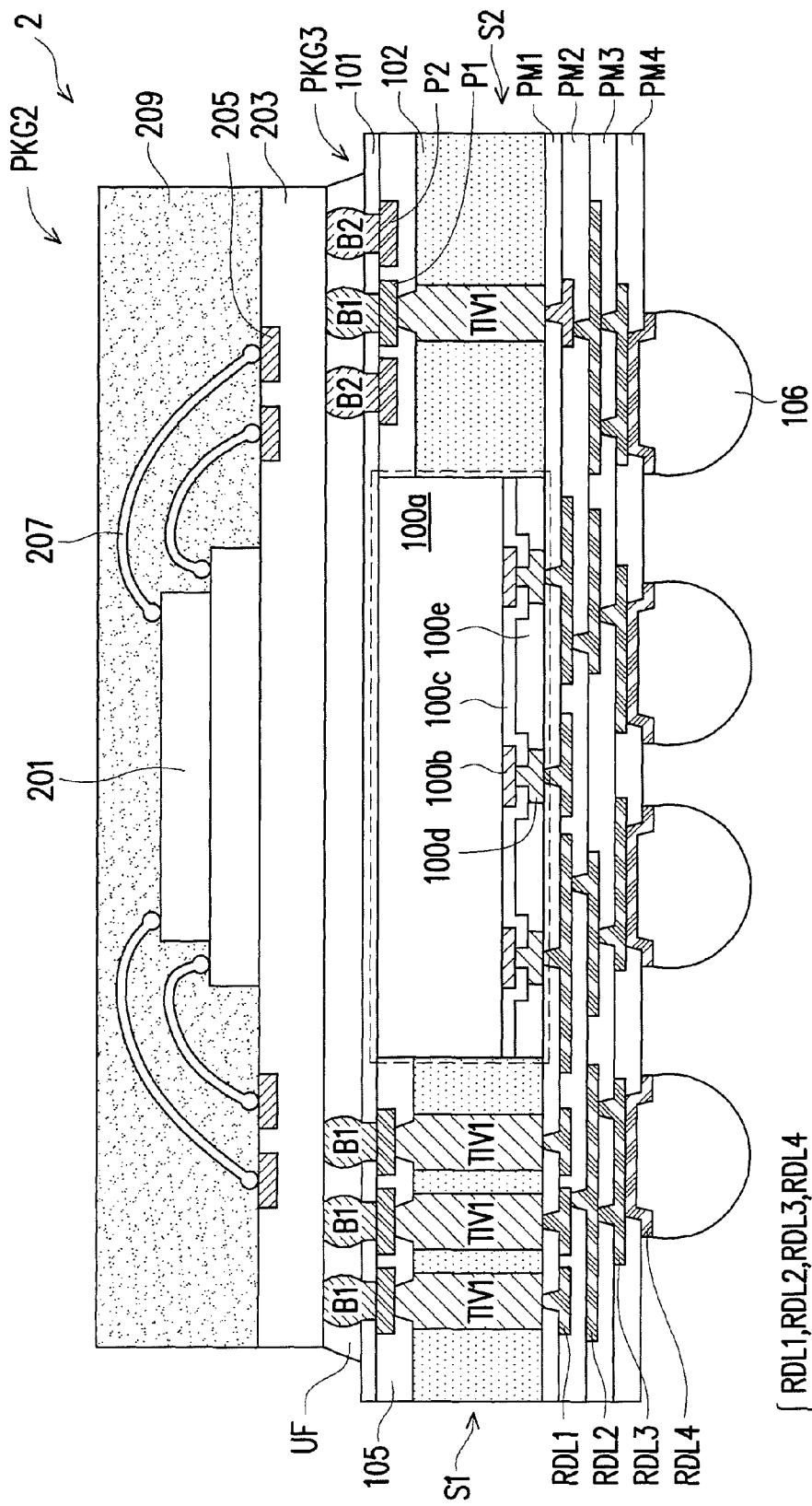

Referring to FIG. 3F and FIG. 3G, a second package structure PKG2 is provided and bonded to the first package structure PKG1, wherein active bumps B1 of the second package structure PKG2 are bonded to the active pads P1 of the first package structure PKG3, and dummy bumps B2 of the second package structure PKG2 are bonded to the dummy pads P2 of the first package structure PKG3. A PoP device 2 is thus completed.

The above embodiments in which the active elements (e.g., active through integrated fan-out vias or active pads) are formed at opposite sides of the first chip are provided for illustration purposes, and are not construed as limiting the present disclosure. In some embodiments, the active elements can be formed at a single side of the first chip upon the design requirements.

Figure 5:
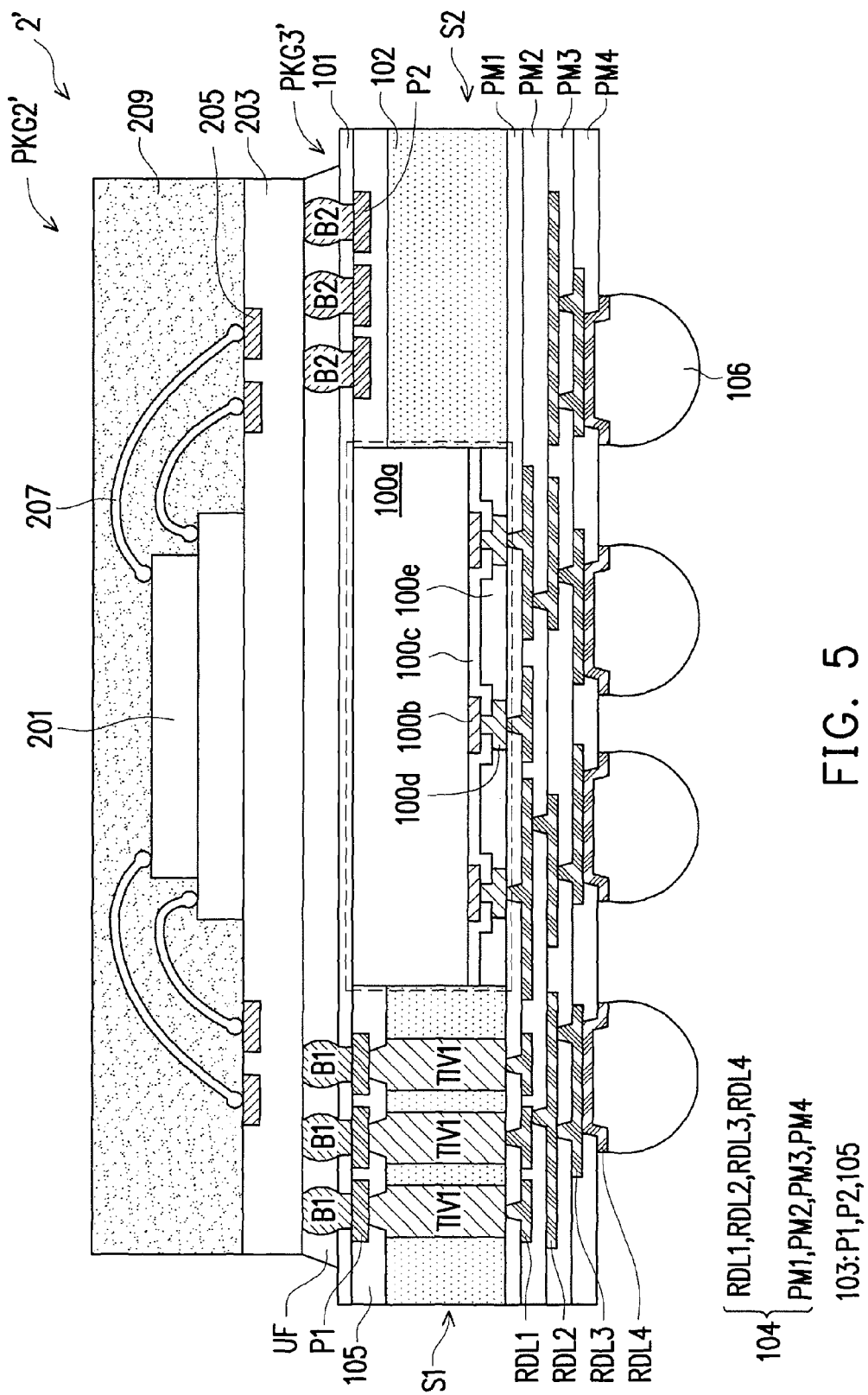
FIG. 5 is a cross-sectional view of a PoP device in accordance with yet alternative embodiments.

In some embodiments, as shown in FIG. 5 and FIG. 6, in the first package structure PKG3', active pads P1 are formed at the first side S1 of the first chip 100, and dummy pads P2 are formed at the second side S2 of the first chip 100. Besides, in the PoP device 2', active bumps B1 of the second package structure PKG2' are bonded to the active pads P1 of the first package structure PKG3', and dummy bumps B2 of the second package structure PKG2' are bonded to the dummy pads P2 of the first package structure PKG3'.

FIG. 7A to FIG. 7G are cross-sectional views of a method of forming a PoP device in accordance with yet alternative embodiments.

Figure 7A:
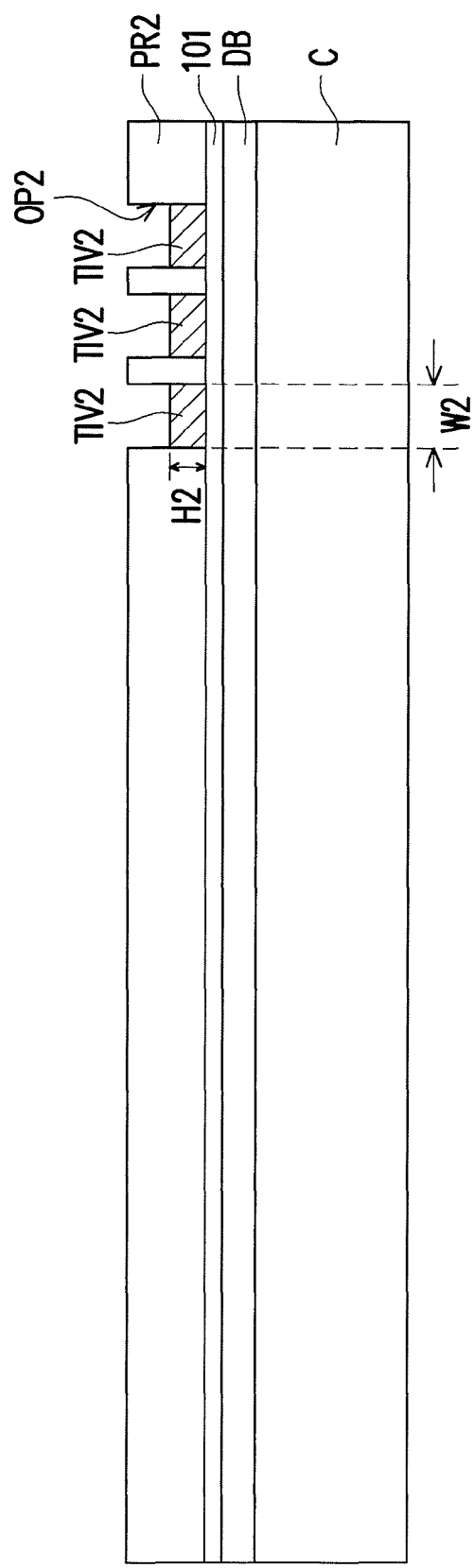
FIG. 7A to FIG. 7G are cross-sectional views of a method of forming a PoP device in accordance with yet alternative embodiments.
Figure 7B:
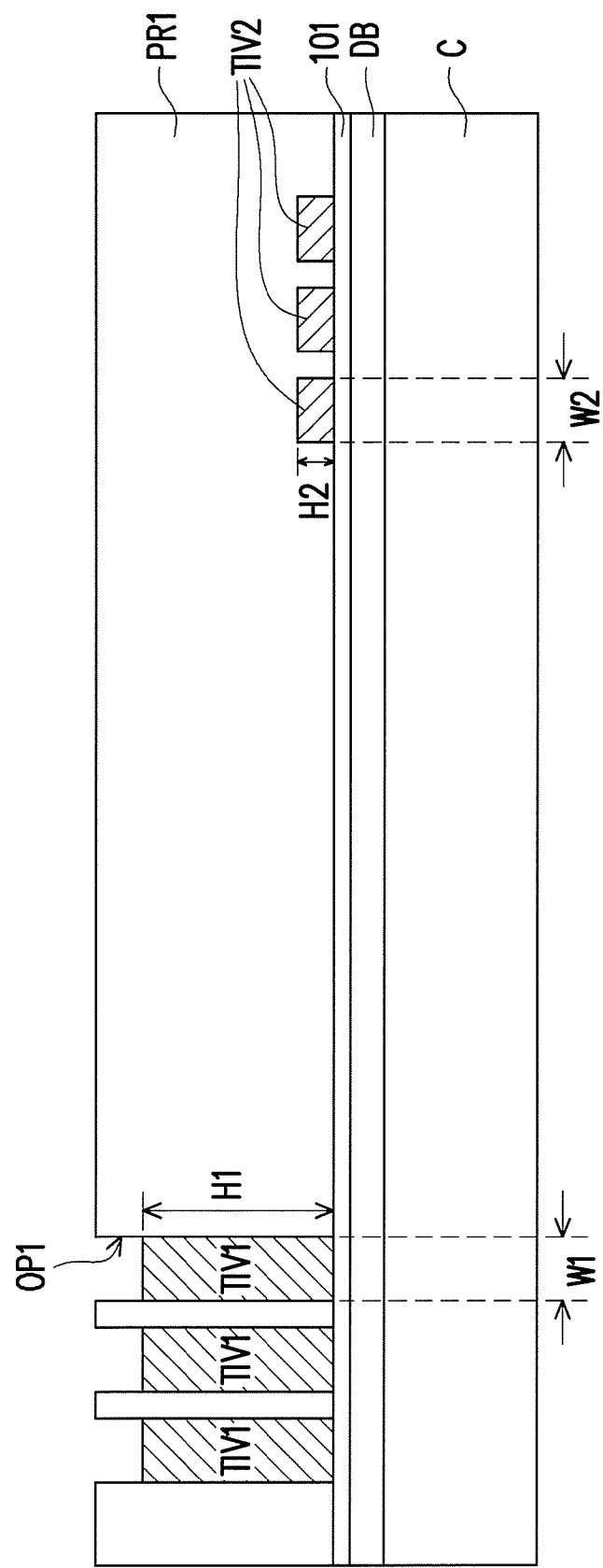

The method of FIG. 7A to FIG. 7G is similar to the method of FIG. 1A to FIG. 1G, and the difference between them lies in the shapes of the formed dummy through integrated fan-out vias are different. Specifically, the height of the dummy through integrated fan-out vias formed in FIGS. 7A-7B is less than the height of the dummy through integrated fan-out vias formed in FIGS. 1A-1B. The difference is illustrated in details below, and the similarity is not iterated herein.

Referring to FIG. 7A, a plurality of dummy through integrated fan-out vias TIV2 is formed on a carrier C. In some embodiments, a photoresist layer PR2 with openings OP2 is formed on the dielectric layer 101 of the carrier C. In some embodiments, the openings OP2 have a width W2. Thereafter, an electroplating process is performed, so that dummy through integrated fan-out vias TIV2 having a width W2 are formed in the openings OP2 of the photoresist layer PR2. The photoresist layer PR2 is then removed.

Referring to FIG. 7B, a plurality of active through integrated fan-out vias TIV1 is formed on the carrier C. In some embodiments, a photoresist layer PR1 with openings OP1 is formed on the dielectric layer 101 of the carrier C. In some embodiments, the openings OP1 have a width W1. Thereafter, an electroplating process is performed, so that active through integrated fan-out vias TIV1 having a width W1 are formed in the openings OP1 of the photoresist layer PR1. The photoresist layer PR1 is then removed.

In some embodiments, the dummy through integrated fan-out vias TIV2 are formed prior to the formation of the active through integrated fan-out vias TIV1. In alternative embodiments, the dummy through integrated fan-out vias TIV2 are formed after the formation of the active through integrated fan-out vias TIV1.

In some embodiments, the method of forming the active and dummy through-visa with different heights includes forming a first group of through integrated fan-out vias and a second group of through integrated fan-out vias with the same height, and reducing the height of the first group of through integrated fan-out vias by an etching back process or a suitable technique.

In some embodiments, the width W1 of the active through integrated fan-out vias TIV1 is substantially the same as the width W2 of the dummy through integrated fan-out vias TIV2. However, the present disclosure is not limited thereto. In alternative embodiments, the width W1 of the active through integrated fan-out vias TIV1 is different from the width W2 of the dummy through integrated fan-out vias TIV2. In some embodiments, the height H1 of the active through integrated fan-out vias TIV1 is greater than the height H2 of the dummy through integrated fan-out vias TIV2.

Figure 7C:
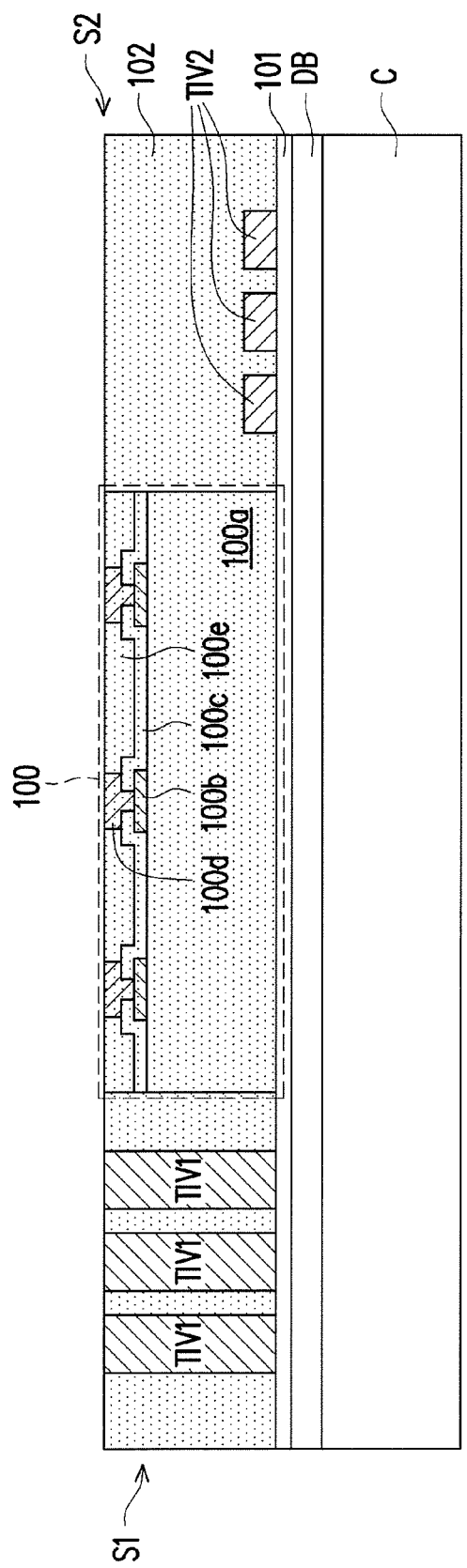

Referring to FIG. 7C, a first chip 100 is picked and placed on the carrier C such that the active through integrated fan-out vias TIV1 and the dummy through integrated fan-out vias TIV2 are aside or around the first chip 100. Thereafter, an encapsulant 102 is formed aside the first chip 100 and the active through integrated fan-out vias TIV1, and covers the dummy through integrated fan-out vias TIV2. In some embodiments, the encapsulant 102 exposes the surfaces of the active through integrated fan-out vias TIV1 and the connectors 100d, and covers the surfaces of the dummy through integrated fan-out vias TIV2. Specifically, the active through integrated fan-out vias TIV1 penetrate through the encapsulant 102 and the surfaces thereof are exposed for further electrical connection, while the dummy through integrated fan-out vias TIV2 are fully encapsulated by the encapsulant 102.

Figure 8:
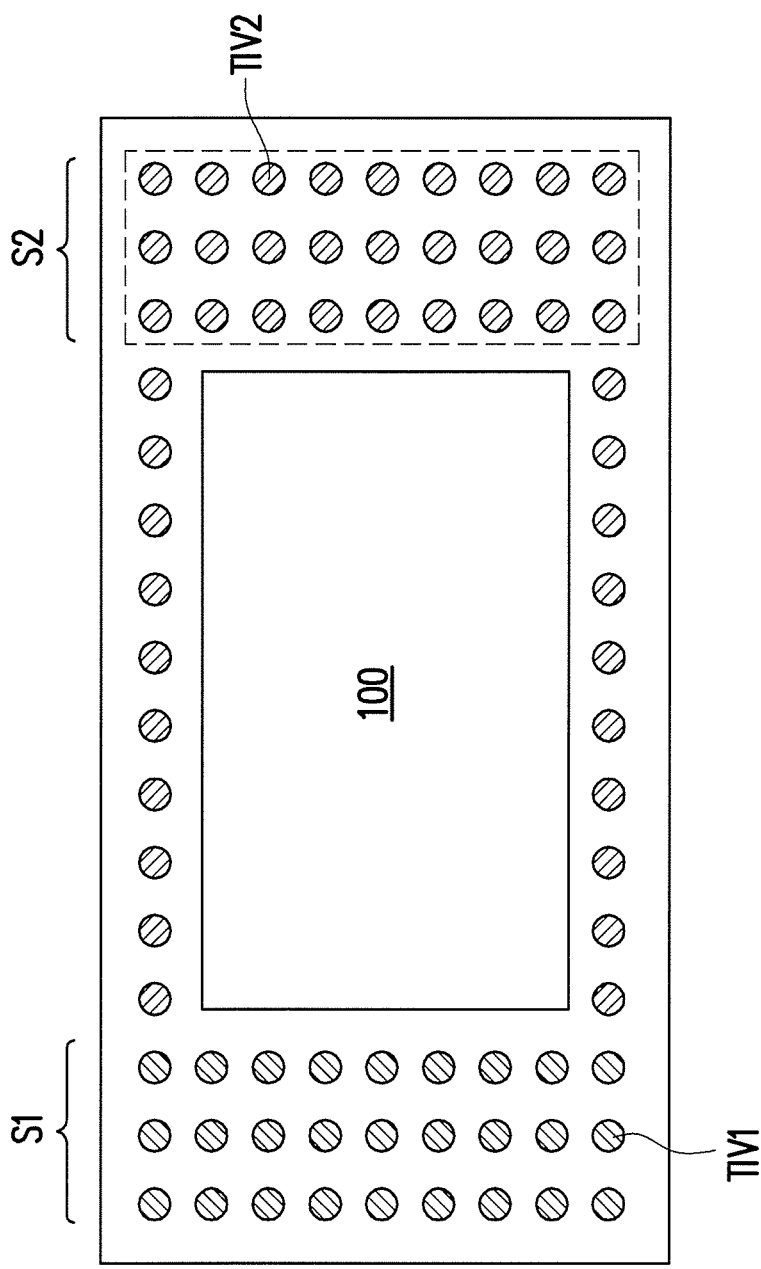
FIG. 8 illustrates a top view of active and dummy through integrated fan-out vias in accordance with yet alternative embodiments.

It is noted that, in some embodiments, the total number of the active through integrated fan-out vias TIV1 at a first side S1 of the first chip 100 is substantially the same as the total number of the dummy through integrated fan-out vias TIV2 at a second side S2 of the first chip 100, as show in FIG. 8. Such disposition is beneficial to improve the PoP bonding performance.

Figure 7D:
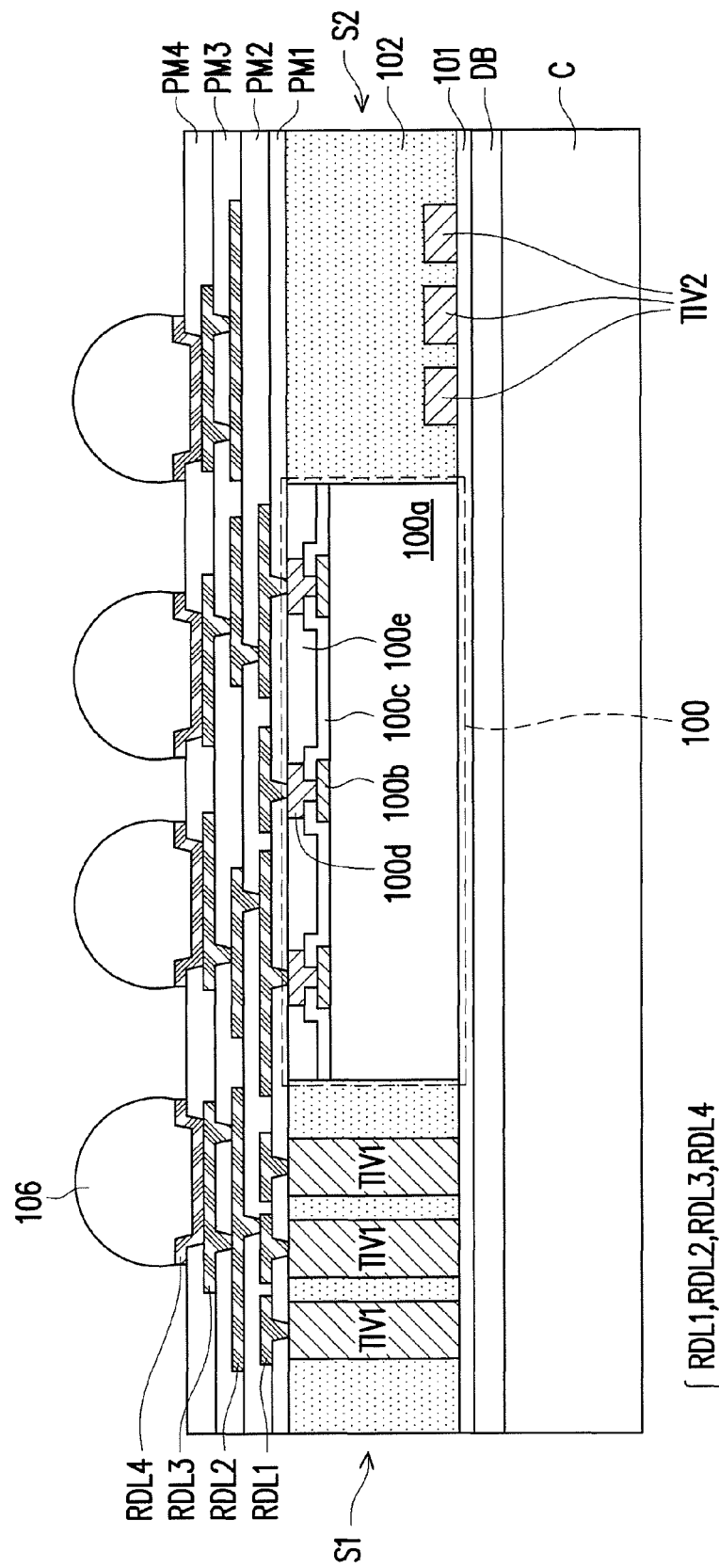

Referring to FIG. 7D, a distribution layer 104 is formed over and electrically connected to the first chip 100 and the active through integrated fan-out vias TIV1. In some embodiments, since the dummy through integrated fan-out vias TIV2 are fully encapsulated by the encapsulant 102, formation of RDL1 caps right above the dummy through integrated fan-out vias TIV2 is not required, and thus, the flexibility of RDL1 routability is accordingly improved. Thereafter, bumps 106 are formed over and electrically connected to the redistribution layer structure 104.

Figure 7E:
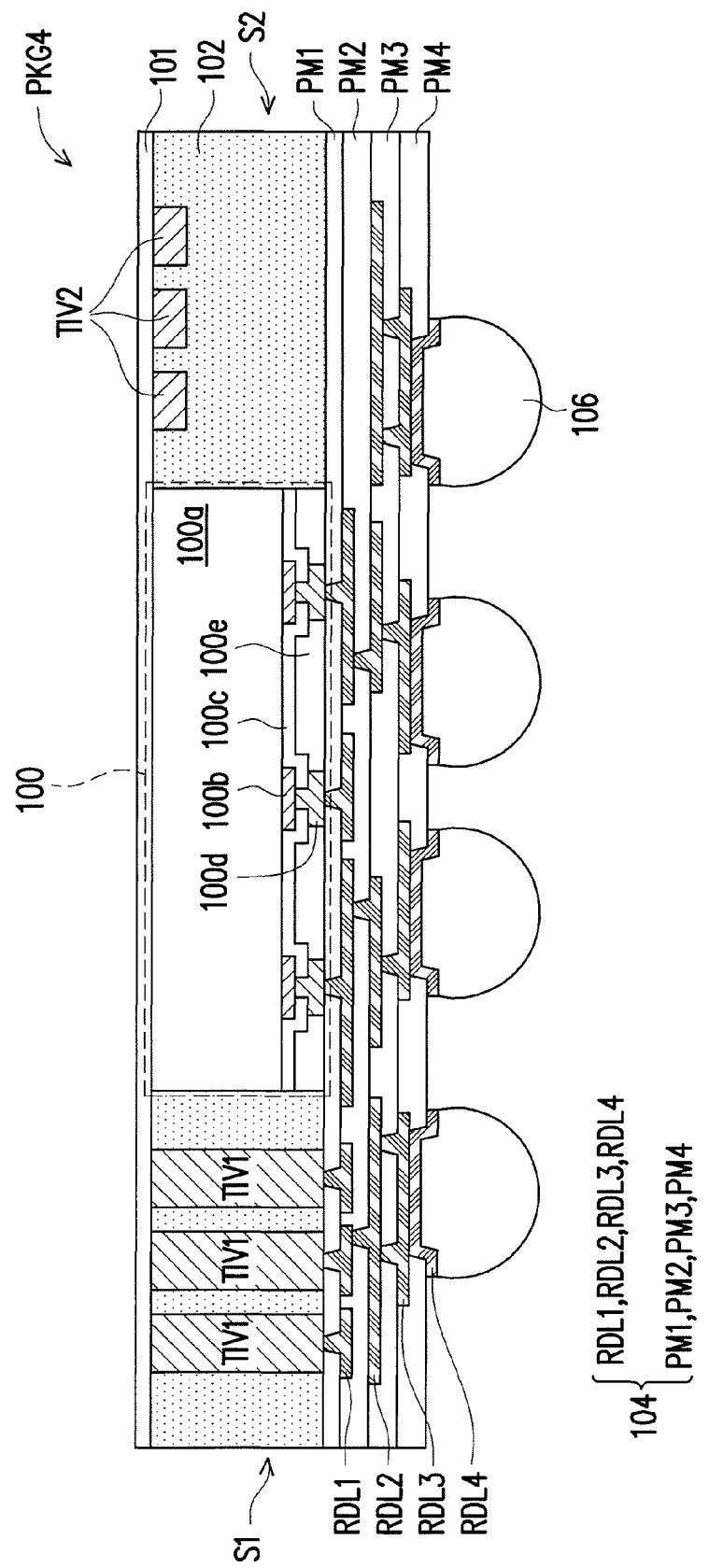

Referring to FIG. 7E, the carrier C is de-bonded from the backside of the first package structure PKG4.

Figure 7F:
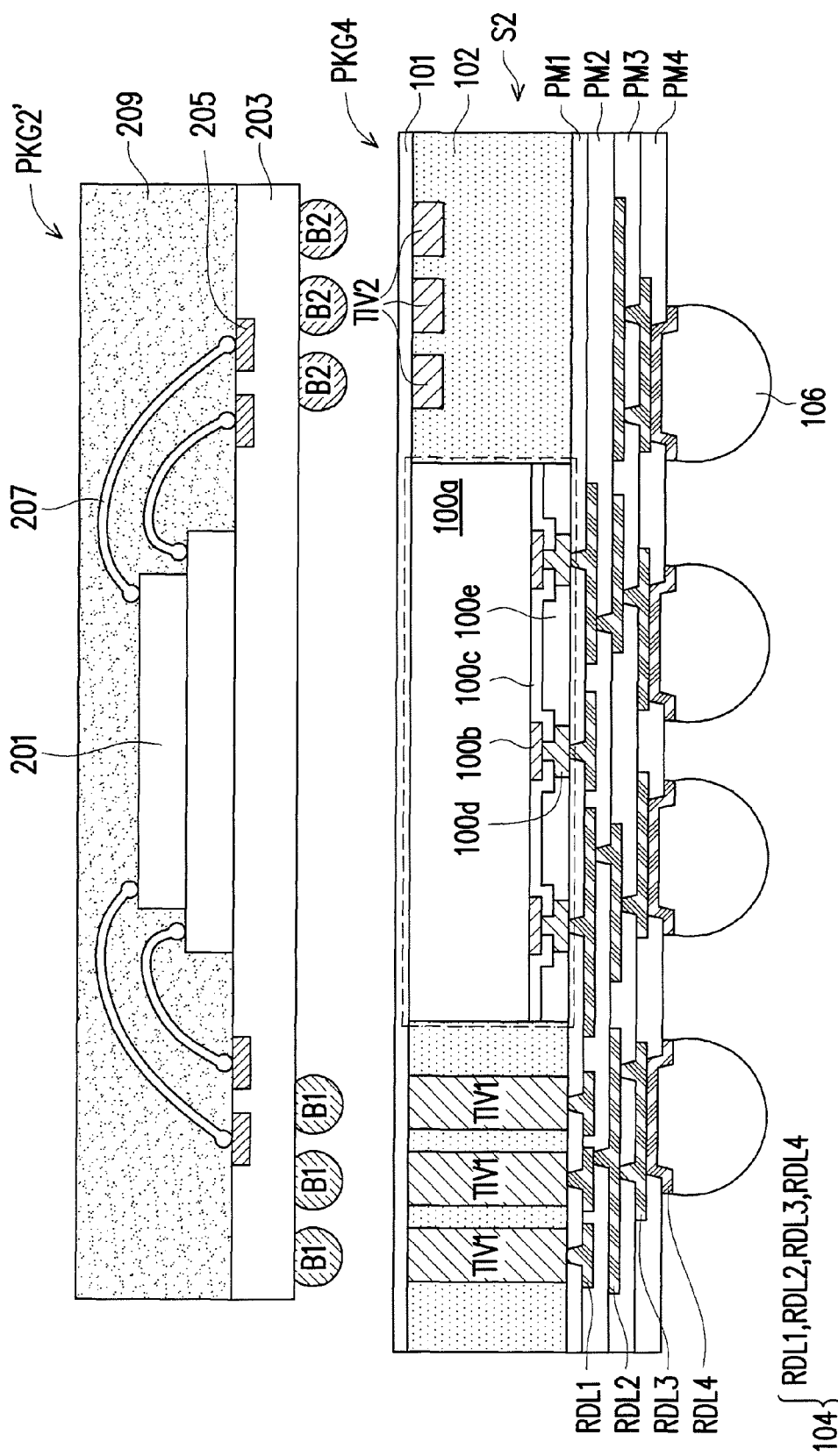
Figure 7G:
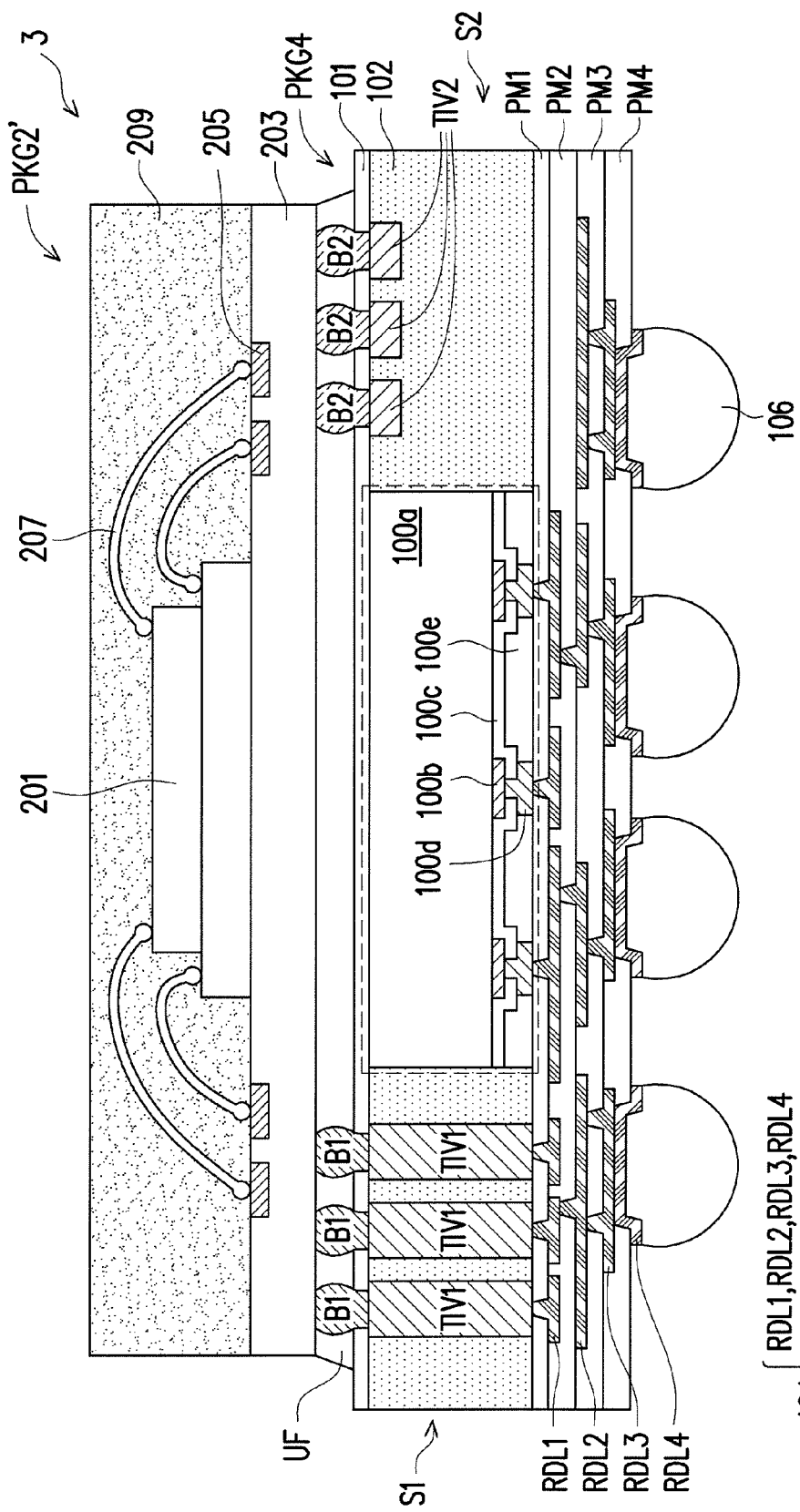

Referring to FIG. 7F and FIG. 7G, a second package structure PKG2' is provided and bonded to the first package structure PKG4, wherein active bumps B1 of the second package structure PKG2' are bonded to the active through integrated fan-out vias TIV1 of the first package structure PKG4, and dummy bumps B2 of the second package structure PKG2' are bonded to the dummy through integrated fan-out vias TIV2 of the first package structure PKG4. A PoP device 3 is thus completed.

FIG. 9A to FIG. 9G are cross-sectional views of a method of forming a PoP device in accordance with yet alternative embodiments.

Figure 9A:
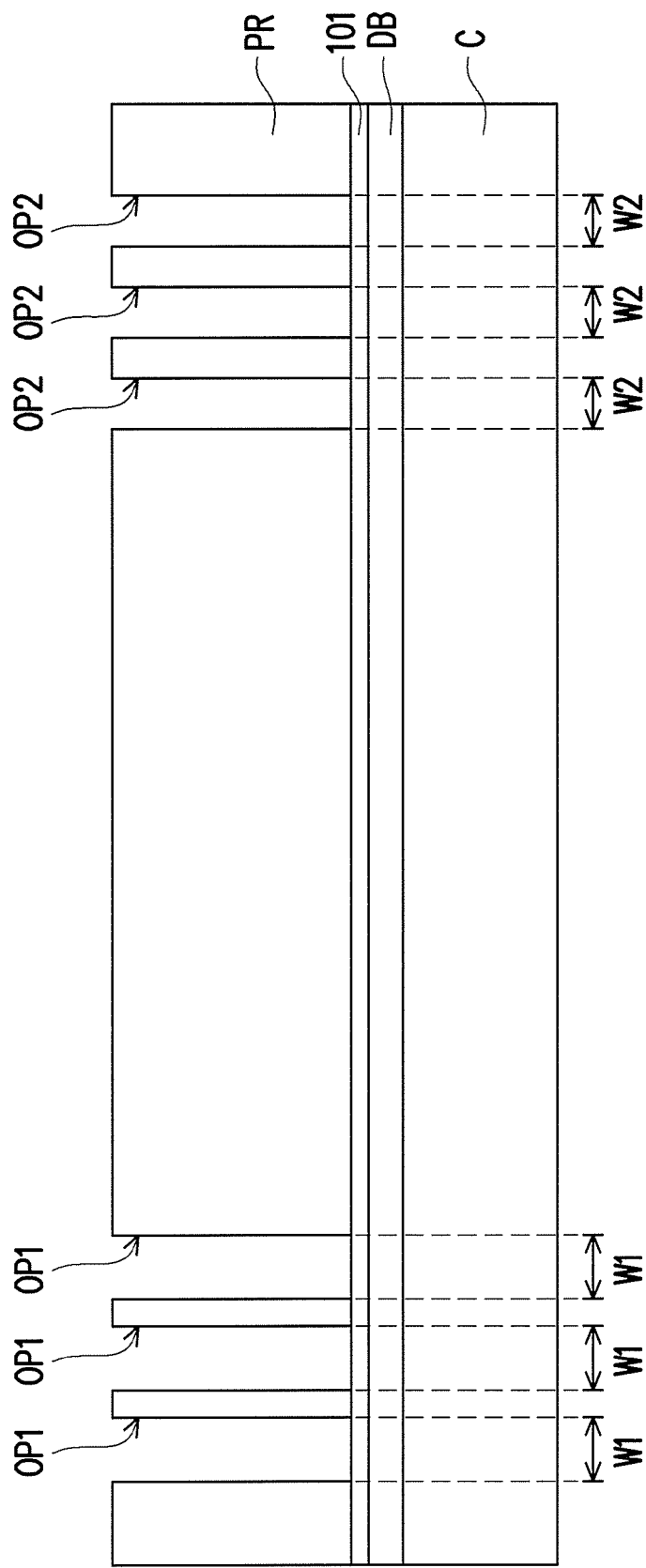
FIG. 9A to FIG. 9G are cross-sectional views of a method of forming a PoP device in accordance with still alternative embodiments.
Figure 9B:
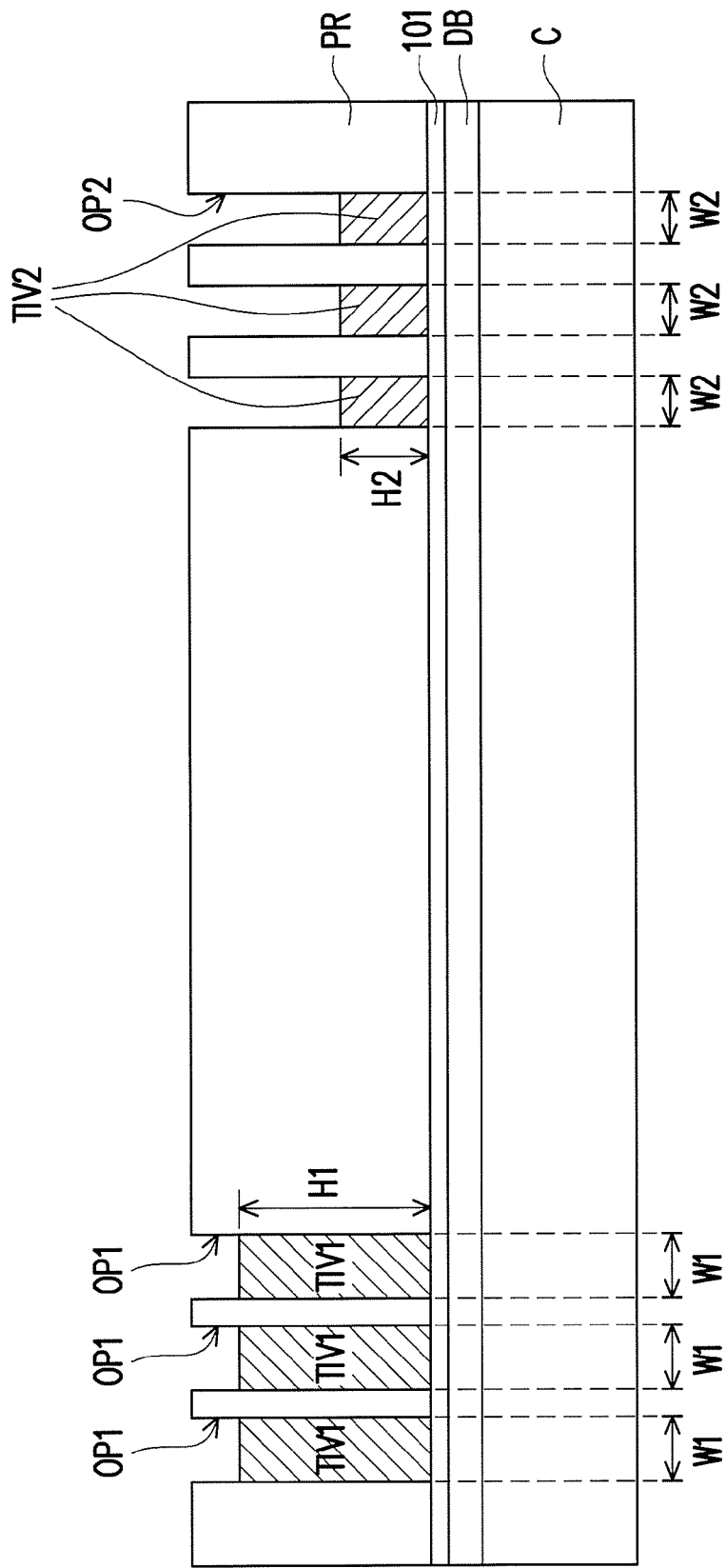

The method of FIG. 9A to FIG. 9B provides a single photolithography step (rather than two photolithography steps provided by the method of FIG. 7A to FIG. 7B) to form active and dummy through integrated fan-out vias with different heights. The difference is illustrated in details below, and the similarity is not iterated herein.

Referring to FIG. 9A and FIG. 9B, a plurality of active through integrated fan-out vias TIV1 and a plurality of dummy through integrated fan-out vias TIV2 are formed on a carrier C. In some embodiments, a photoresist layer PR with openings OP1 and OP2 is forming on the dielectric layer 101 of the carrier C. In some embodiments, the openings OP1 have a width W1, the openings OP2 have a width W2, and the width W1 is greater than the width W2, as shown in FIG. 9A.

Thereafter, an electroplating process is performed, so that active through integrated fan-out vias TIV1 having a width W1 are formed in the openings OP1 and dummy through integrated fan-out vias TIV2 having a width W2 are formed in the openings OP2 of the photoresist layer PR. In some embodiments, such PR design leads to a slower plating rate inside the smaller openings OP2 than inside the larger opening OP1. Therefore, the dummy through integrated fan-out vias TIV2 are formed shorter in the smaller openings OP2 and the active through integrated fan-out vias TIV1 are formed taller in the larger openings OP1. That is, the height H2 and width W2 of the dummy through integrated fan-out vias TIV2 are less than the height H1 and the width W1 of the active through integrated fan-out vias TIV1. The photoresist layer PR is then removed.

Figure 9C:
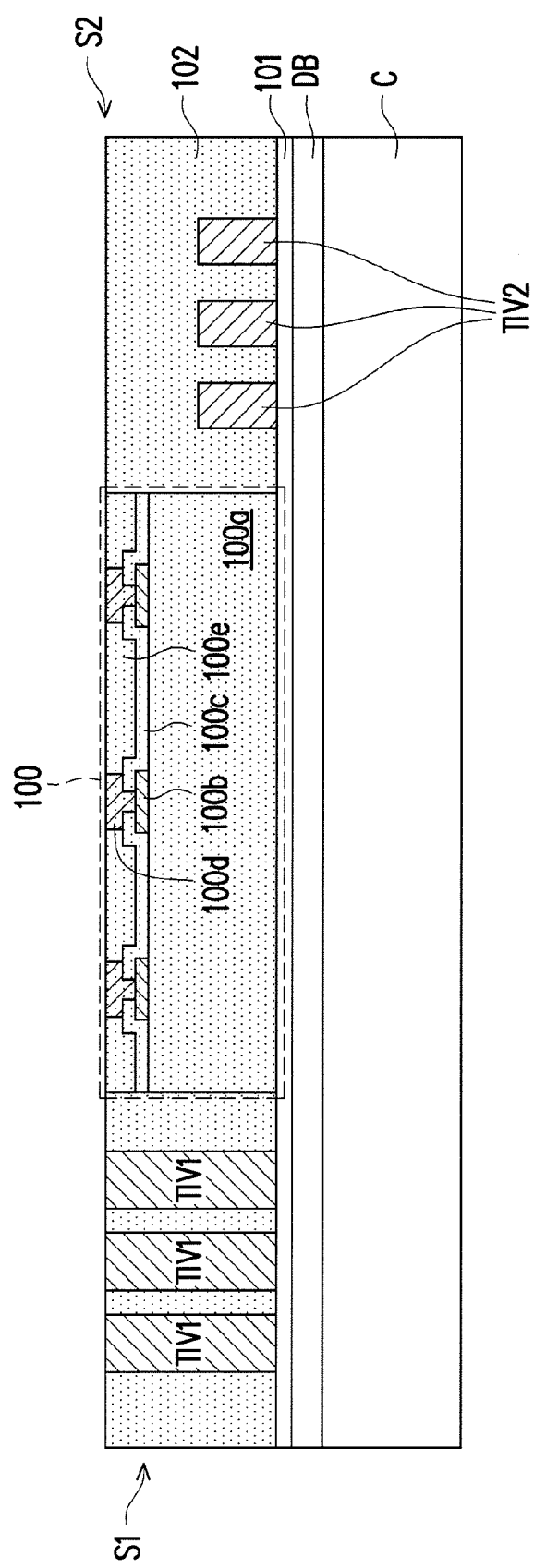

Referring to FIG. 9C, a first chip 100 is picked and placed on the carrier C such that the active through integrated fan-out vias TIV1 and the dummy through integrated fan-out vias TIV2 are aside or around the first chip 100. Thereafter, an encapsulant 102 is formed aside the first chip 100 and the active through integrated fan-out vias TIV1, and covers the dummy through integrated fan-out vias TIV2.

Figure 10:
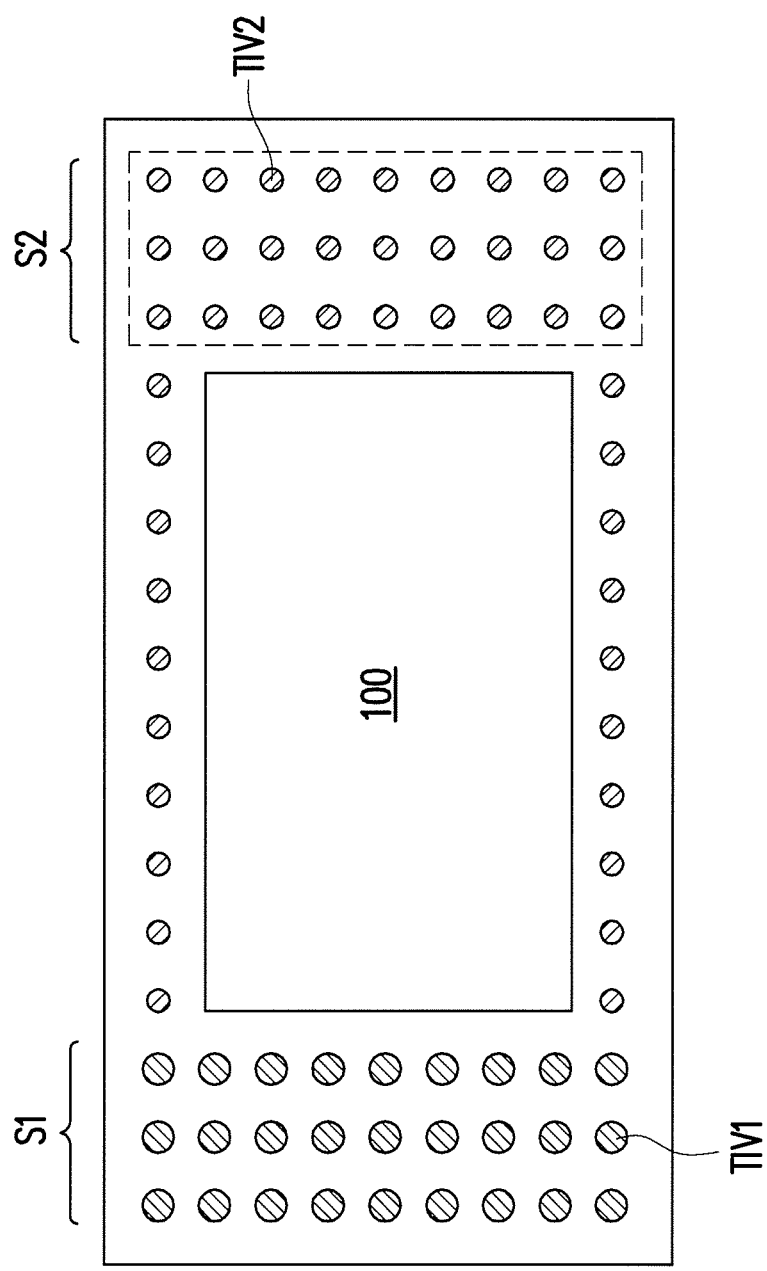
FIG. 10 illustrates a top view of active and dummy through integrated fan-out vias in accordance with still alternative embodiments.

It is noted that, in some embodiments, the total number of the active through integrated fan-out vias TIV1 at a first side S1 of the first chip 100 is substantially the same as the total number of the dummy through integrated fan-out vias TIV2 at a second side S2 of the first chip 100, as show in FIG. 10. Such disposition is beneficial to improve the PoP bonding performance.

Figure 9D:
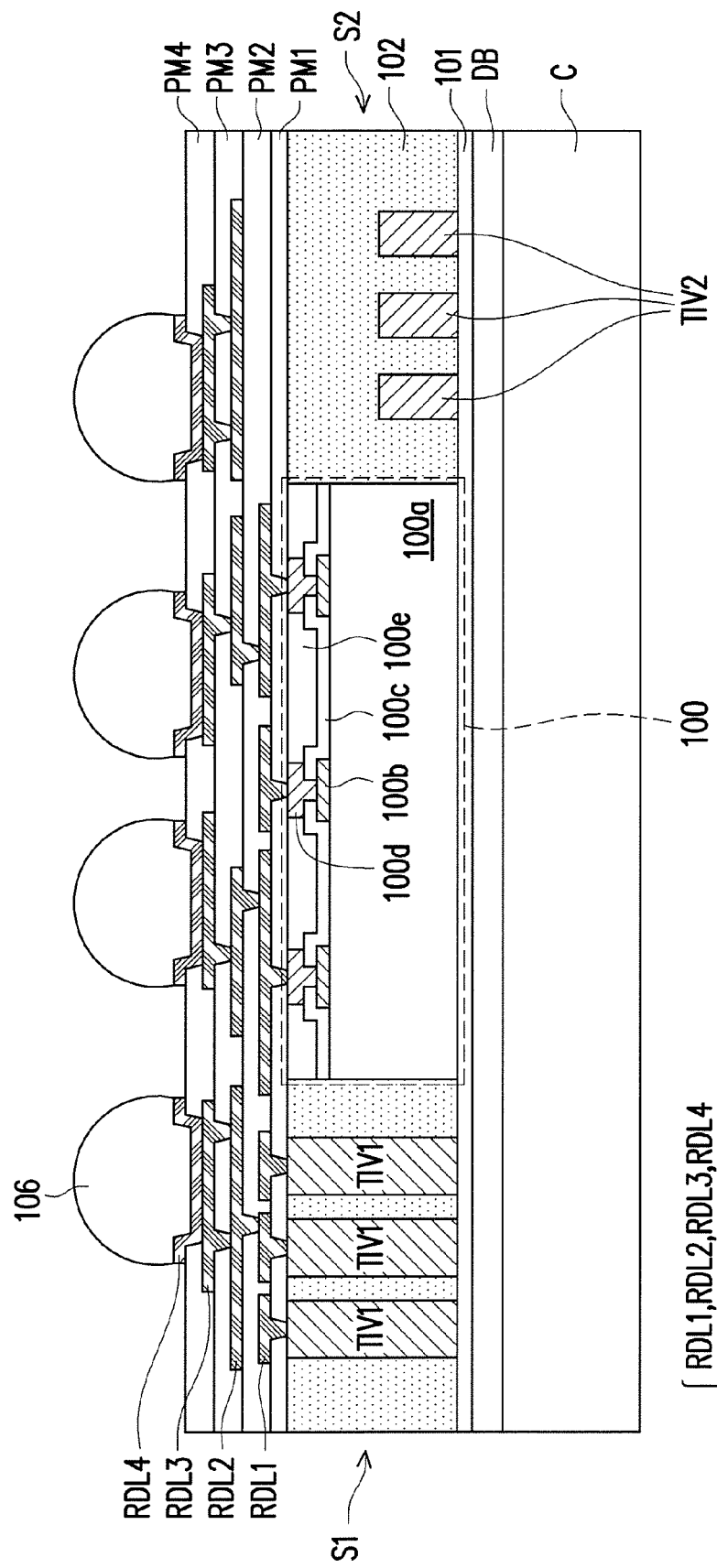

Referring to FIG. 9D, a distribution layer 104 is formed over and electrically connected to the first chip 100 and the active through integrated fan-out vias TIV1. In some embodiments, since the dummy through integrated fan-out vias TIV2 are fully encapsulated by the encapsulant 102, formation of RDL1 caps right above the dummy through integrated fan-out vias TIV2 is not required, and thus, the flexibility of RDL1 routability is accordingly improved. Thereafter, bumps 106 are formed over and electrically connected to the redistribution layer structure 104.

Figure 9E:
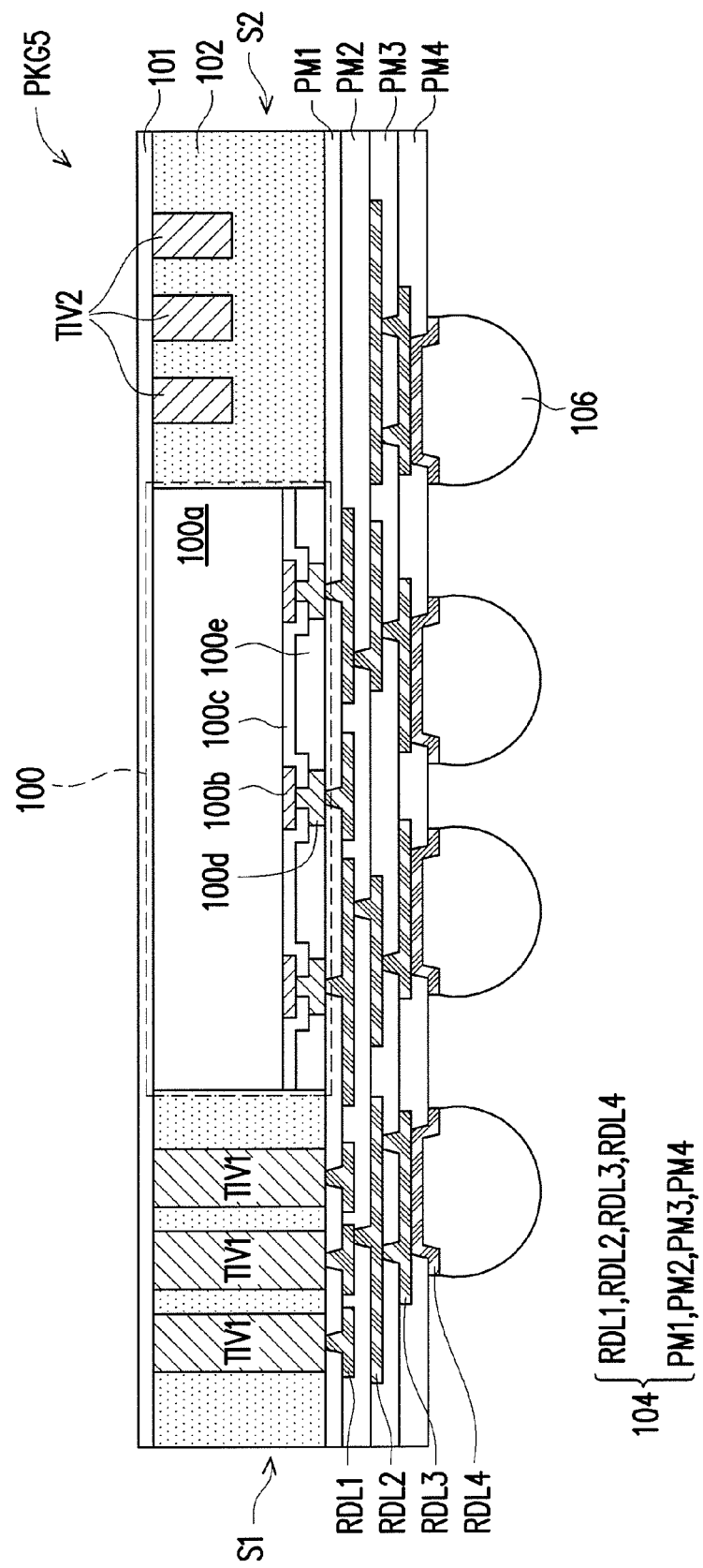

Referring to FIG. 9E, the carrier C is de-bonded from the backside of the first package structure PKG5.

Figure 9F:
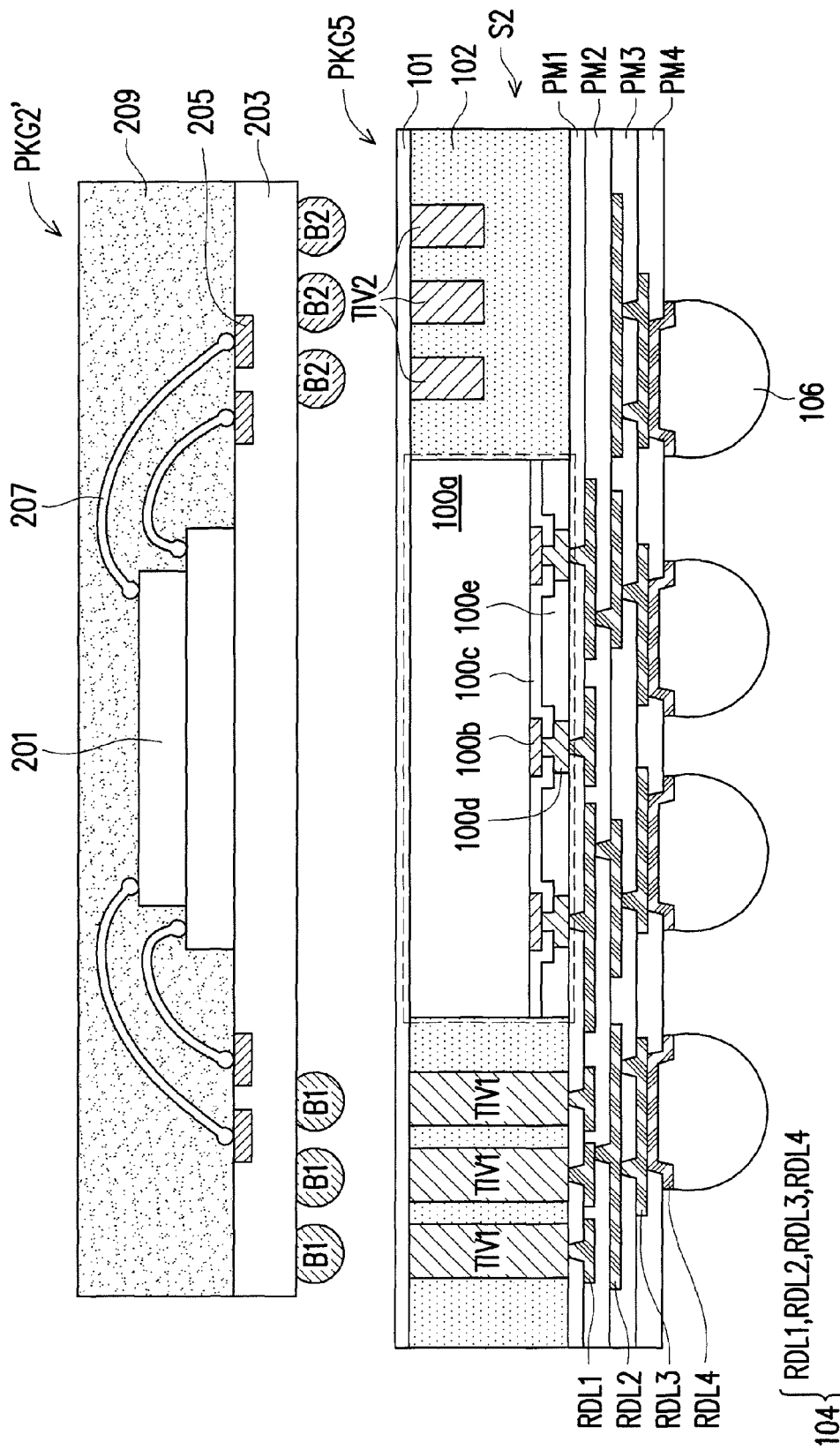
Figure 9G:
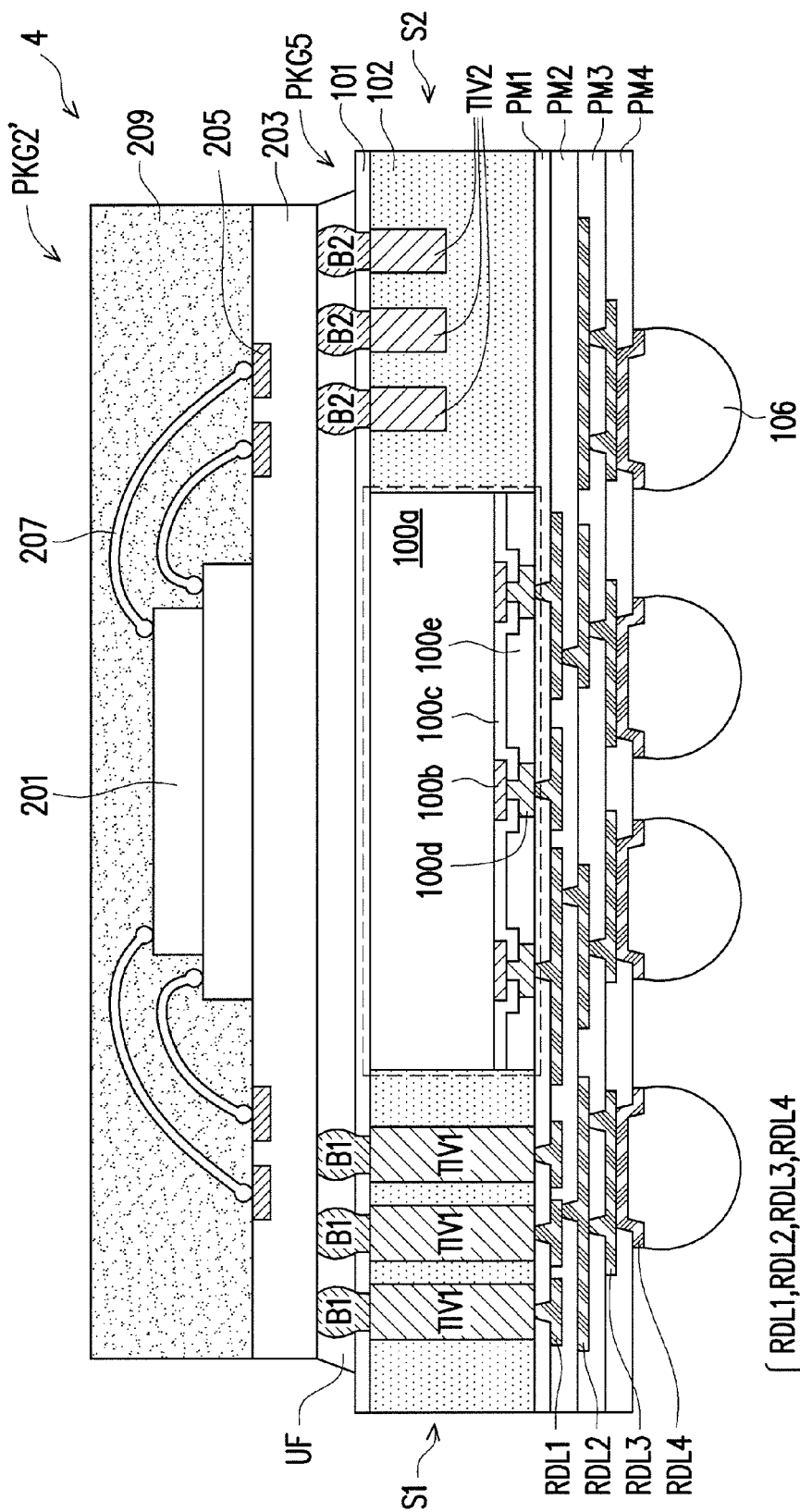

Referring to FIG. 9F and FIG. 9G, a second package structure PKG2' is provided and bonded to the first package structure PKG5, wherein active bumps B1 of the second package structure PKG2' are bonded to the active through integrated fan-out vias TIV1 of the first package structure PKG5, and dummy bumps B2 of the second package structure PKG2' are bonded to the dummy through integrated fan-out vias TIV2 of the first package structure PKG5. A PoP device 4 is thus completed.

In some embodiments, the present disclosure provides a PoP device 1/3/4 includes a first package structure PKG1/PKG4/PKG5 and a second package structure PKG2/PKG2'. The first package structure PKG1/PKG4/PKG5 includes a first chip 100, and a plurality of active through integrated fan-out vias TIV1 and a plurality of dummy through integrated fan-out vias TIV2 aside the first chip 100. The second package structure PKG2/PKG2' includes a plurality active bumps B1 bonded to the plurality of active through integrated fan-out vias TIV1, and a plurality of dummy bumps B2 bonded to the plurality of dummy through integrated fan-out vias TIV2.

In some embodiments, the active through integrated fan-out vias TIV1 are at the first side S1 and the second side S2 of the first chip 100, and the dummy through integrated fan-out vias TIV2 are at one of the first side and the second side (e.g., second side S2) of the first chip 100, as shown in the PoP device 1 of FIG. 1G and FIG. 2. In some embodiments, the total number of the active through integrated fan-out vias TIV1 at the first side S1 of the first chip 100 is at least two times, three times or even five times the total number of the active through integrated fan-out vias TIV1 at the second side S2 of the first chip 100.

In alternative embodiments, the active through integrated fan-out vias TIV1 are at one of the first side S1 and the second side S2 (e.g., first side S1) of the first chip 100, and the dummy through integrated fan-out vias TIV2 are at the other of the first side S1 and the second side S2 (e.g., second side S2) of the first chip 100, as shown in the PoP device 3/4 of FIG. 7G, FIG. 8, FIG. 9G and FIG. 10.

In the above cases, the total number of the active through integrated fan-out vias TIV1 and the dummy through integrated fan-out vias TIV2 at the first side S1 of the first chip 100 is substantially the same as the total number of the active through integrated fan-out vias TIV1 and the dummy through integrated fan-out vias TIV2 at the second side S2 of the first chip 100. Specifically, in the PoP device 1, the total number of through integrated fan-out vias (=the number of active through integrated fan-out vias TIV1+the number of dummy through integrated fan-out vias TIV2) at the first side S1 is substantially the same as the total number of through integrated fan-out vias (=the number of active through integrated fan-out vias TIV1+the number of dummy through integrated fan-out vias TIV2) at the second side S2. In the PoP device 3/4, the total number of through integrated fan-out vias (=the number of active through integrated fan-out vias TIV1; the number of dummy through integrated fan-out vias TIV2 is zero) at the first side S1 is substantially the same as the total number of through integrated fan-out vias (=the number of dummy through integrated fan-out vias TIV2; the number of active through integrated fan-out vias TIV1 is zero) at the second side S2.

In some embodiments, the distribution of the active through integrated fan-out vias TIV1 and the dummy through integrated fan-out vias TIV2 at the first side S1 of the first chip 100 is substantially symmetrical to the distribution of the active through integrated fan-out vias TIV1 and dummy through integrated fan-out vias TIV2 at the second side S2 of the first chip 100, as shown in the PoP device 1/3/4.

In some embodiments, the height of the active through integrated fan-out vias TIV1 is substantially the same as the height of the dummy through integrated fan-out vias TIV2, as shown in the PoP device 1. In alternative embodiments, the height of the active through integrated fan-out vias TIV1 is different from (e.g., greater than) a height of the dummy through integrated fan-out vias TIV2, as shown in the PoP device 3/4.

In some embodiments, the width of the active through integrated fan-out vias TIV1 is substantially the same as the width of the dummy through integrated fan-out vias TIV2, as shown in the PoP device 1/3. In alternative embodiments, the width of the active through integrated fan-out vias TIV1 is different from (e.g., greater than) the width of the dummy through integrated fan-out vias TIV2, as shown in the PoP device 4.

In some embodiments, the present disclosure provides a PoP device 2/2' that includes a first package structure PKG3/PKG3' and a second package structure PKG2/PKG2'. The first package structure PKG3/PKG3' includes a first chip 100, a plurality of active through integrated fan-out vias TIV1, a plurality of active pads P1 electrically connected to the active through integrated fan-out vias TIV1 and a plurality of dummy pads P2 aside the active pads P1. The second package structure PKG2/PKG2' includes a plurality of active bumps B1 bonded to the active pads P1 and a plurality of dummy bumps B2 bonded to the dummy pads P1.

In some embodiments, the active pads P1 are at the first side S1 and the second side S2 of the first chip 100, and the dummy pads P2 are at one of the first side and the second side (e.g., second side S2) of the first chip 100, as shown in the PoP device 2 of FIG. 3G and FIG. 4. In some embodiments, the total number of the active pads P1 at the first side S1 of the first chip 100 is at least two times, three times or even five times the total number of the active pads P1 at the second side S2 of the first chip 100.

In alternative embodiments, the active pads P1 are at one of the first side S1 and the second side S2 (e.g., first side S1) of the first chip 100, and the dummy pads P2 are at the other of the first side S1 and the second side S2 (e.g., second side S2) of the first chip 100, as shown in the PoP device 2' of FIG. 5 and FIG. 6.

In the above cases, the total number of the active pads P1 and the dummy pads P2 at the first side S1 of the first chip 100 is substantially the same as the total number of the active pads P1 and the dummy pads P2 at the second side S2 of the first chip 100. Specifically, in the PoP device 2, the total number of backside pads (=the number of active pads P1+the number of dummy pads P2) at the first side S1 is substantially the same as the total number of backside pads (=the number of active pads P1+the number of dummy pads P2) at the second side S2. In the PoP device 2', the total number of backside pads (=the number of active pads P1; the number of dummy pads P2 is zero) at the first side S1 is substantially the same as the total number of backside pads (=the number of dummy pads P2; the number of active pads P1 is zero) at the second side S2.

In some embodiments, the distribution of the active pads P1 and the dummy pads P2 at the first side S1 of the first chip 100 is substantially symmetrical to the distribution of the active pads P1 and dummy pads P2 at the second side S2 of the first chip 100, as shown in the PoP device 2/2'.

In some embodiments, the present disclosure provides a PoP device 3/4 includes a first package structure PKG4/PKG5 and a second package structure PKG2'. The first package structure PKG4/PKG5 includes a first chip 100, and a plurality of active through integrated fan-out vias TIV1 and a plurality of dummy through integrated fan-out vias TIV2 aside the first chip 100. Besides, a dimension of the active through integrated fan-out vias TIV1 is different from a dimension of the dummy through integrated fan-out vias TIV2. In some embodiments, the dimension includes a height, a width or both. The second package structure PKG2' includes a plurality of active bumps B1 bonded to the active through integrated fan-out vias TIV1, and a plurality of dummy bumps B2 bonded to the dummy through integrated fan-out vias TIV2.

In some embodiments, the width of the active through integrated fan-out vias TIV1 is substantially the same as the width of the dummy through integrated fan-out vias TIV2, and the height of the active through integrated fan-out vias TIV1 is greater than the height of the dummy through integrated fan-out vias TIV2, as shown in the PoP device 3.

In alternative embodiments, the width of the active through integrated fan-out vias TIV1 is greater than the width of the dummy through integrated fan-out vias TIV2, and the height of the active through integrated fan-out vias TIV1 is greater than the height of the dummy through integrated fan-out vias TIV2, as shown in the PoP device 4.

In view of the above, in a PoP device of the present disclosure, a first package structure is bonded to a second package structure with active through integrated fan-out vias or pads bonded to active bumps and dummy through integrated fan-out vias or pads bonded to dummy bumps. By such manner, the conventional poor filling of the under-fill layer, poor joint, and package shit issues are not observed, and the package performance can be significantly improved.

In accordance with some embodiments of the present disclosure, a PoP device includes a first package structure and a second package structure. The first package structure includes a first chip, and a plurality of active through integrated fan-out vias and a plurality of dummy through integrated fan-out vias aside the first chip. The second package structure includes a plurality active bumps bonded to the plurality of active through integrated fan-out vias, and a plurality of dummy bumps bonded to the plurality of dummy through integrated fan-out vias. Besides, a total number of the active through integrated fan-out vias and the dummy through integrated fan-out vias at a first side of the first chip is substantially the same as a total number of the active through integrated fan-out vias and the dummy through integrated fan-out vias at a second side of the first chip.

In accordance with alternative embodiments of the present disclosure, a PoP device includes a first package structure and a second package structure. The first package structure includes a first chip, a plurality of active through integrated fan-out vias, a plurality of active pads electrically connected to the active through integrated fan-out vias and a plurality of dummy pads aside the active pads. The second package structure includes a plurality of active bumps bonded to the active pads and a plurality of dummy bumps bonded to the dummy pads.

In accordance with yet alternative embodiments of the present disclosure, a PoP device includes a first package structure and a second package structure. The first package structure includes a first chip, and a plurality of active through integrated fan-out vias and a plurality of dummy through integrated fan-out vias aside the first chip. Besides, a dimension of the active through integrated fan-out vias is different from a dimension of the dummy through integrated fan-out vias. The second package structure includes a plurality of active bumps bonded to the active through integrated fan-out vias, and a plurality of dummy bumps bonded to the dummy through integrated fan-out vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A PoP device, comprising:
a first package structure, comprising:
  a first chip; and
  a plurality of active through integrated fan-out vias and a plurality of dummy through integrated fan-out vias aside the first chip; and
a second package structure, comprising:
  a plurality active bumps bonded to the plurality of active through integrated fan-out vias; and
  a plurality of dummy bumps bonded to the plurality of dummy through integrated fan-out vias,
wherein a total number of the active through integrated fan-out vias and the dummy through integrated fan-out vias at a first side of the first chip is substantially the same as a total number of the active through integrated fan-out vias and the dummy through integrated fan-out vias at a second side of the first chip.

2. The PoP device of claim 1, wherein a distribution of the active through integrated fan-out vias and the dummy through integrated fan-out vias at the first side of the first chip is substantially symmetrical to a distribution of the active through integrated fan-out vias and dummy through integrated fan-out vias at the second side of the first chip.

3. The PoP device of claim 1, wherein a height of the active through integrated fan-out vias is substantially the same as a height of the dummy through integrated fan-out vias.

4. The PoP device of claim 1, wherein a height of the active through integrated fan-out vias is different from a height of the dummy through integrated fan-out vias.

5. The PoP device of claim 1, wherein a width of the active through integrated fan-out vias is substantially the same as a width of the dummy through integrated fan-out vias.

6. The PoP device of claim 1, wherein a width of the active through integrated fan-out vias is different from a width of the dummy through integrated fan-out vias.

7. The PoP device of claim 1, wherein the active through integrated fan-out vias are at the first side and the second side of the first chip, and the dummy through integrated fan-out vias are at one of the first side and the second side of the first chip.

8. The PoP device of claim 1, wherein a total number of the active through integrated fan-out vias at the first side of the first chip is at least two times a total number of the active through integrated fan-out vias at the second side of the first chip.

9. The PoP device of claim 1, wherein the active through integrated fan-out vias are at one of the first side and the second side of the first chip, and the dummy through integrated fan-out vias are at the other of the first side and the second side of the first chip.

10. A PoP device, comprising:
a first package structure, comprising:
  a first chip;
  a plurality of active through integrated fan-out vias;
  a plurality of active pads electrically connected to the active through integrated fan-out vias; and
  a plurality of dummy pads aside the active pads; and
a second package structure, comprising:
  a plurality of active bumps bonded to the active pads; and
  a plurality of dummy bumps bonded to the dummy pads,
wherein the dummy pads are at one of a first side and a second side of the first chip.

11. The PoP device of claim 10, wherein a total number of the active pads and the dummy pads at a first side of the first chip is substantially the same as a total number of the active pads and the dummy pads at a second side of the first chip.

12. The PoP device of claim 10, wherein a distribution of the active pads and the dummy pads at a first side of the first chip is substantially symmetrical to a distribution of the active pads and dummy pads at a second side of the first chip.

13. The PoP device of claim 10, wherein the active pads are at the first side and the second side of the first chip.

14. The PoP device of claim 10, wherein the active pads are at the other of the first side and the second side of the first chip.

15. A PoP device, comprising:
a first package structure, comprising:
  a first chip; and
  a plurality of active through integrated fan-out vias and a plurality of dummy through integrated fan-out vias aside the first chip, wherein a dimension of the active through integrated fan-out vias is different from a dimension of the dummy through integrated fan-out vias; and
a second package structure, comprising:
  a plurality of active bumps bonded to the active through integrated fan-out vias; and
  a plurality of dummy bumps bonded to the dummy through integrated fan-out vias.

16. The PoP device of claim 15, wherein the dimension comprises a height, a width or both.

17. The PoP device of claim 15, wherein a width of the active through integrated fan-out vias is substantially the same as a width of the dummy through integrated fan-out vias, and a height of the active through integrated fan-out vias is greater than a height of the dummy through integrated fan-out vias.

18. The PoP device of claim 15, wherein a width of the active through integrated fan-out vias is greater than a width of the dummy through integrated fan-out vias, and a height of the active through integrated fan-out vias is greater than a height of the dummy through integrated fan-out vias.

19. The PoP device of claim 15, wherein a total number of the active through integrated fan-out vias at a first side of the first chip is substantially the same as a total number of the dummy through integrated fan-out vias at a second side of the first chip.

20. The PoP device of claim 15, wherein a distribution of the active through integrated fan-out vias at a first side of the first chip is substantially symmetrical to a distribution of the dummy through integrated fan-out vias at a second side of the first chip.

* * * * *